United States Patent [19]
Beilin et al.

[11] Patent Number: 5,854,534
[45] Date of Patent: *Dec. 29, 1998

[54] CONTROLLED IMPEDENCE INTERPOSER SUBSTRATE

[75] Inventors: Solomon I. Beilin, San Carlos; William T. Chou, Cupertino; David Kudzuma; Michael G. Lee, both of San Jose; Michael G. Peters, Santa Clara; James J. Roman, Los Altos; Som S. Swamy, Danville; Wen-chou Vincent Wang, Cupertino; Larry L. Moresco, San Carlos; Teruo Murase, San Jose, all of Calif.

[*] Notice: The term of this patent shall not extend beyond the expiration date of Pat. No. 5,854,534.

[73] Assignee: Fujitsu Limited, Japan

[21] Appl. No.: 559,369

[22] Filed: Nov. 16, 1995

Related U.S. Application Data

[63] Continuation-in-part of Ser. No. 274,915, Jul. 14, 1994, abandoned, which is a continuation-in-part of Ser. No. 157,332, Nov. 22, 1993, Pat. No. 5,426,563, which is a continuation of Ser. No. 925,962, Aug. 5, 1992, abandoned.

[51] Int. Cl.$^6$ .......................... H01L 23/52; H01L 23/04; H01L 23/053; H01L 23/34
[52] U.S. Cl. .......................... 257/691; 257/698; 257/700; 257/723; 361/794
[58] Field of Search .................. 257/723, 664, 257/691, 700, 698; 361/794

[56] References Cited

U.S. PATENT DOCUMENTS

| | | | |
|---|---|---|---|
| 3,611,317 | 10/1971 | Bonfeld | 340/173 R |
| 3,629,787 | 12/1971 | Wilson | 439/67 |
| 3,643,135 | 2/1972 | Devore et al. | 361/730 |
| 3,949,274 | 4/1976 | Anacker | 361/735 |
| 4,202,007 | 5/1980 | Dougherty et al. | 257/697 |
| 4,249,302 | 2/1981 | Crepeau | 29/830 |

(List continued on next page.)

FOREIGN PATENT DOCUMENTS

| | | | |
|---|---|---|---|
| 0506225 | 9/1992 | European Pat. Off. | H01L 23/538 |
| 2096541 | 2/1972 | France | H01L 1/100 |

(List continued on next page.)

OTHER PUBLICATIONS

Val, et al., "3–D Interconnection for Ultra–Dense Multichip Modules," *IEEE Transactions On Components, Hybrids, and Manufacturing Technology*, vol. 13, No. 4, Dec. 1990, pp. 814–821.

Andrews, "Parallel Printed Circuit Manifold," *Motorola Technical Developments*, vol. 7, Oct. 1987, pp. 22–23.

(List continued on next page.)

*Primary Examiner*—Teresa M. Arroyo
*Attorney, Agent, or Firm*—Coudert Brothers

[57] ABSTRACT

An interposer substrate for mounting an integrated circuit chip to a substrate, and method of making the same, are shown. The interposer substrate comprises power supply paths and controlled impedance signal paths that are substantially isolated from each other. Power supply is routed though rigid segments and signals are routed though a thin film flexible connector that runs from the upper surface of the interposer substrate to the lower surface. Bypass capacitance is incorporated into the interposer substrate and connected to the power supply so that it is positioned very close to the integrated circuit chip. The interposer may be fabricated by forming a multilayered thin film structure including the signal paths over a rigid substrate having vias formed therein, removing the central portion of the substrate leaving the two end segments, and folding and joining the end segments such that the vias are connected. In another embodiment of the invention, a separate power plate is provided for carrying the power lines. Portions of the power plate, with a multilayered thin film structure thereon, are cut and folded to form interposers. Methods of making single-chip interposers are also disclosed.

23 Claims, 20 Drawing Sheets

U.S. PATENT DOCUMENTS

| | | | |
|---|---|---|---|
| 4,271,588 | 6/1981 | Nowak | 29/827 |
| 4,289,922 | 9/1981 | Devlin | 174/52 |
| 4,371,744 | 2/1983 | Badet et al. | 174/68.5 |
| 4,453,176 | 6/1984 | Chance et al. | 257/778 |
| 4,480,288 | 10/1984 | Gazdik et al. | 361/748 |
| 4,489,363 | 12/1984 | Goldberg | 361/693 |
| 4,499,607 | 2/1985 | Higgins | 455/606 |
| 4,502,098 | 2/1985 | Brown et al. | 361/690 |
| 4,509,099 | 4/1985 | Takamatsu et al. | 361/748 |
| 4,525,921 | 7/1985 | Carson et al. | 29/577 |
| 4,547,834 | 10/1985 | Dumont et al. | 361/721 |
| 4,574,331 | 3/1986 | Smolley | 361/735 |
| 4,581,679 | 4/1986 | Smolley | 361/742 |
| 4,601,526 | 7/1986 | White et al. | 339/17 CF |
| 4,631,636 | 12/1986 | Andrews | 361/699 |
| 4,638,348 | 1/1987 | Brown et al. | 257/700 |
| 4,640,010 | 2/1987 | Brown | 29/832 |
| 4,648,179 | 3/1987 | Bhattacharyya et al. | 29/832 |
| 4,679,118 | 7/1987 | Johnson et al. | 361/718 |
| 4,688,151 | 8/1987 | Kraus | 361/773 |
| 4,695,872 | 9/1987 | Chatterjee | 257/700 |
| 4,716,259 | 12/1987 | Tokura et al. | 174/68.5 |
| 4,718,163 | 1/1988 | Berland et al. | 29/837 |
| 4,721,831 | 1/1988 | Vora | 174/68.5 |
| 4,727,410 | 2/1988 | Higgins, III | 257/700 |
| 4,733,461 | 3/1988 | Nakano | 29/830 |
| 4,739,444 | 4/1988 | Zushi et al. | 361/691 |
| 4,743,568 | 5/1988 | Wood | 437/189 |
| 4,770,640 | 9/1988 | Walter | 439/69 |
| 4,771,366 | 9/1988 | Blake et al. | 361/705 |
| 4,774,630 | 9/1988 | Reisman et al. | 361/718 |
| 4,781,969 | 11/1988 | Kobayashi et al. | 428/209 |
| 4,800,461 | 1/1989 | Dixon et al. | 361/751 |
| 4,801,992 | 1/1989 | Golubic | 257/668 |
| 4,803,595 | 2/1989 | Kraus et al. | 361/784 |
| 4,807,021 | 2/1989 | Okumura | 257/777 |
| 4,811,082 | 3/1989 | Jacobs et al. | 257/700 |
| 4,841,355 | 6/1989 | Parks | 257/777 |
| 4,855,809 | 8/1989 | Malhi et al. | 257/684 |
| 4,855,871 | 8/1989 | Young | 361/748 |
| 4,858,073 | 8/1989 | Gregory | 361/708 |
| 4,862,249 | 8/1989 | Carlson | 257/668 |
| 4,866,508 | 9/1989 | Eichelberger et al. | 257/723 |
| 4,868,712 | 9/1989 | Woodman | 361/689 |
| 4,871,317 | 10/1989 | Jones | 439/68 |
| 4,873,764 | 10/1989 | Grimm | 29/830 |
| 4,884,167 | 11/1989 | Mine | 361/702 |
| 4,894,706 | 1/1990 | Sato et al. | 361/770 |
| 4,899,439 | 2/1990 | Potter et al. | 29/846 |
| 4,901,136 | 2/1990 | Neugebauer et al. | 257/723 |
| 4,902,637 | 2/1990 | Kondou et al. | 438/152 |
| 4,910,643 | 3/1990 | Williams | 361/748 |
| 4,922,059 | 5/1990 | Walker et al. | 174/254 |
| 4,922,378 | 5/1990 | Malhi et al. | 361/721 |
| 4,930,002 | 5/1990 | Takenaka et al. | 257/697 |
| 4,931,134 | 6/1990 | Hatkevitz et al. | 156/630 |
| 4,937,659 | 6/1990 | Chall, Jr. | 257/685 |
| 4,937,707 | 6/1990 | McBride | 361/751 |
| 4,939,568 | 7/1990 | Kato et al. | 257/777 |
| 4,953,005 | 8/1990 | Carlson et al. | 257/666 |
| 4,953,060 | 8/1990 | Lauffer | 361/710 |
| 4,956,695 | 9/1990 | Robinson et al. | 257/686 |
| 4,956,746 | 9/1990 | Gates, Jr. | 361/699 |
| 4,956,749 | 9/1990 | Chang | 361/721 |
| 4,958,258 | 9/1990 | Charruau | 361/715 |
| 4,963,697 | 10/1990 | Peterson et al. | 174/252 |
| 4,965,702 | 10/1990 | Lott et al. | 361/748 |
| 4,970,577 | 11/1990 | Ogihara et al. | 257/698 |
| 4,983,533 | 1/1991 | Go | 438/12 |
| 4,984,132 | 1/1991 | Sakurai | 361/794 |
| 4,991,000 | 2/1991 | Bone et al. | 257/686 |
| 4,992,908 | 2/1991 | Solomon | 361/783 |
| 4,996,587 | 2/1991 | Hinrichsmeyer et al. | 257/676 |
| 5,003,376 | 3/1991 | Iversen | 257/714 |
| 5,006,920 | 4/1991 | Schafer et al. | 257/700 |
| 5,006,925 | 4/1991 | Bregman et al. | 257/717 |
| 5,007,841 | 4/1991 | Smolley | 439/66 |
| 5,010,448 | 4/1991 | Kobari | 361/773 |
| 5,016,138 | 5/1991 | Woodman | 361/688 |
| 5,019,945 | 5/1991 | Smolley | 361/803 |
| 5,025,306 | 6/1991 | Johnson et al. | 257/700 |
| 5,027,253 | 6/1991 | Lauffer et al. | 361/321.4 |
| 5,031,072 | 7/1991 | Malhi et al. | 361/721 |
| 5,032,896 | 7/1991 | Little et al. | 257/686 |
| 5,034,569 | 7/1991 | Gofuku et al. | 361/748 |
| 5,049,982 | 9/1991 | Lee et al. | 257/722 |
| 5,051,865 | 9/1991 | Kato | 361/718 |
| 5,053,856 | 10/1991 | Davidson | 257/714 |
| 5,055,907 | 10/1991 | Jacobs | 257/773 |
| 5,060,116 | 10/1991 | Grobman et al. | 361/792 |
| 5,061,990 | 10/1991 | Arakawa et al. | 257/676 |
| 5,065,277 | 11/1991 | Davidson | 361/689 |
| 5,081,563 | 1/1992 | Feng et al. | 361/795 |
| 5,089,880 | 2/1992 | Meyer et al. | 257/777 |
| 5,102,828 | 4/1992 | Marchisi | 29/827 |
| 5,121,297 | 6/1992 | Haas | 361/751 |
| 5,132,613 | 7/1992 | Papae et al. | 329/158 |
| 5,142,448 | 8/1992 | Kober et al. | 361/748 |
| 5,144,532 | 9/1992 | Wessely et al. | 361/748 |
| 5,155,661 | 10/1992 | Nagesh et al. | 361/721 |
| 5,177,594 | 1/1993 | Chance et al. | 257/678 |
| 5,204,806 | 4/1993 | Sasaki et al. | 361/749 |
| 5,222,014 | 6/1993 | Lin | 361/721 |
| 5,237,204 | 8/1993 | Val | 257/698 |
| 5,258,330 | 11/1993 | Khandros et al. | 29/593 |
| 5,278,724 | 1/1994 | Angulas et al. | 361/707 |
| 5,309,324 | 5/1994 | Herandez et al. | 361/734 |
| 5,334,804 | 8/1994 | Love et al. | 174/267 |
| 5,346,861 | 9/1994 | Khandros et al. | 438/15 |
| 5,347,159 | 9/1994 | Khandros et al. | 257/692 |
| 5,349,501 | 9/1994 | Kawakami | 361/776 |
| 5,355,282 | 10/1994 | Yokemura et al. | 361/760 |
| 5,357,400 | 10/1994 | Takekawa | 361/704 |
| 5,362,656 | 11/1994 | McMahon et al. | 437/21 |
| 5,396,034 | 3/1995 | Fujita et al. | 174/261 |
| 5,404,273 | 4/1995 | Akagawa | 361/707 |
| 5,419,038 | 5/1995 | Wang et al. | 29/830 |
| 5,426,565 | 6/1995 | Anderson | 361/711 |
| 5,435,733 | 7/1995 | Chernicky et al. | 439/68 |
| 5,479,110 | 12/1995 | Crane et al. | 324/757 |

FOREIGN PATENT DOCUMENTS

| | | | |
|---|---|---|---|
| 216 826 | 12/1984 | German Dem. Rep. | H01L 2/53 |
| 61-101067 | 5/1986 | Japan | H01L 25/04 |
| 61-99361 | 5/1986 | Japan | H01L 25/04 |
| 61-168951 | 7/1986 | Japan | H01L 25/04 |
| 1-136360 | 5/1989 | Japan | H01L 23/52 |
| 2-199859 | 8/1990 | Japan | H01L 25/04 |
| 2250138 | 5/1992 | United Kingdom | H05K 1/02 |
| WO 92/03035 | 2/1992 | WIPO | H05K 7/20 |

OTHER PUBLICATIONS

Iverson, "Next Generation Power Electronics for Space and Aircraft Part II—Packaging," *Proceedings of the 26th Intersociety Energy Conversion Engineering Conference*, IECEC–91, Aug. 4–9, 1991, pp. 177–182.

"Power Grid Image For Embedded Arrays," IBM Technical Disclosure Bulletin, vol. 32, No. 8B, Jan. 1990.

Moresco, "System Interconnect Issues for Sub–Nanosecond Signal Transmission," *Proceedings of the International Symposium on Advances in Interconnection and Packaging*, SPIE, Nov. 5, 1990, pp. 202–213.

Nagesh, et al., "A Comparative Study of Interconnect Technologies," *Proceedings of the 9th International Electronics Packaging Conference*, vol. I (1989), from Multichip Modules by IEEE, Inc., 1991, pp. 557–566.

Liu, et al., "Integrated Circuit Chip Package," IBM Technical Disclosure Bulletin, vol. 17, No. 7, Dec. 1974.

Tummala, et al., *Microelectronics Packaging Handbook*, New York: Van Nostrand Reinhold, 1989 pp. 955–974; pp. 1034–1038; pp. 1071–1076.

Richard C. Dorf, ed. *The Electrical Engineering Handbook*, Boca Raton: CRC Press, 1993, pp. 499–529.

Scott S. Simpson, "*Invisicon®The Invisible Interconnection™—A connection system with high contact density and controlled impedance,*" Rogers Corporation, Product Information Brochure, date unknown.

Ken Smith, "An Inexpensive, High Frequency, High Power, VLSI Chip Carrier," *IEEE 1985 Custom Integrated Circuits Conference*, 1985, pp. 42–45.

"Removal of Heat From Direct Chip Attach Circuitry," IBM Technical Disclosure Bulletin, vol. 32, No. 4A, Sep. 1989, pp. 346–348.

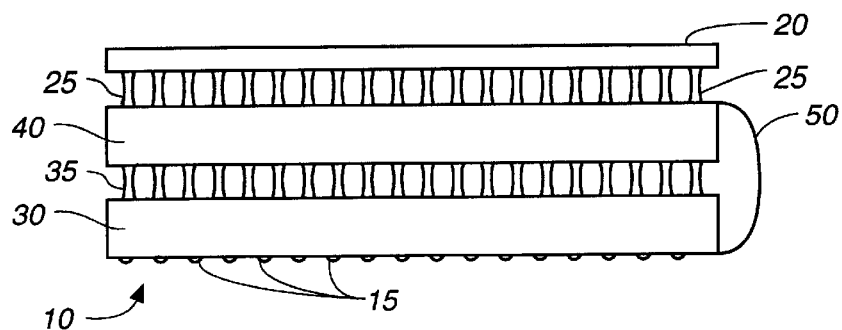
FIG._1
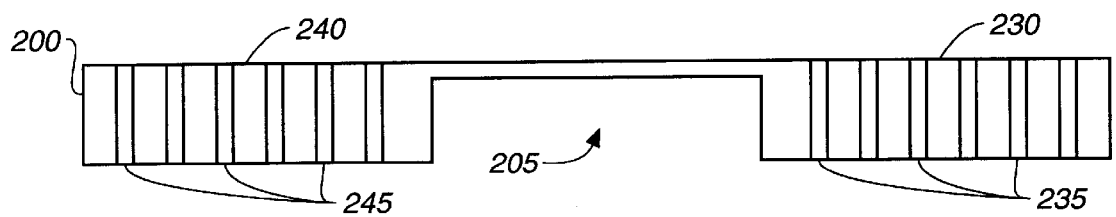
FIG._2A
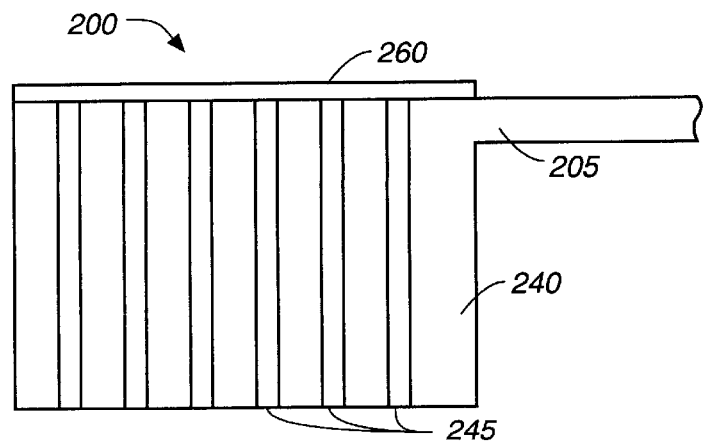
FIG._2B

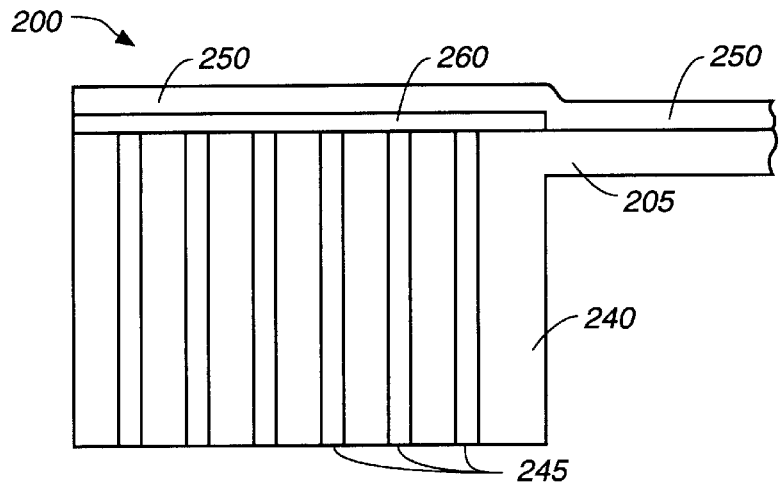
FIG._2C
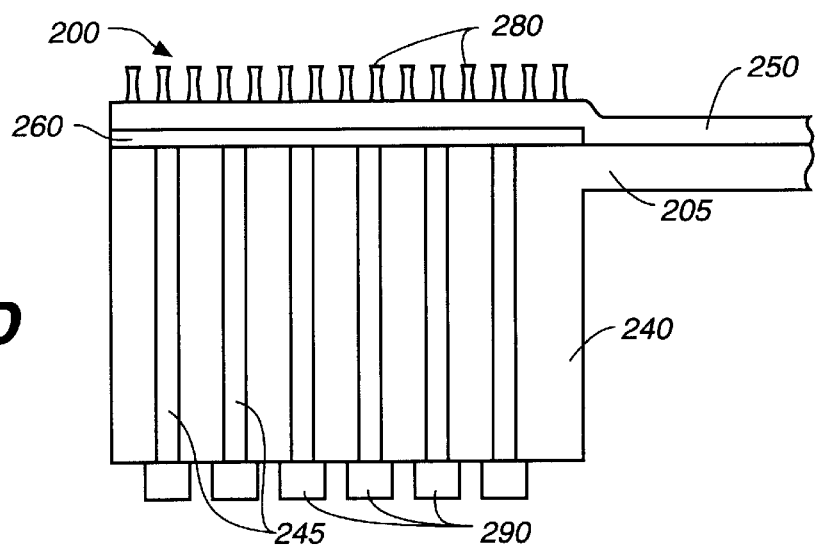
FIG._2D
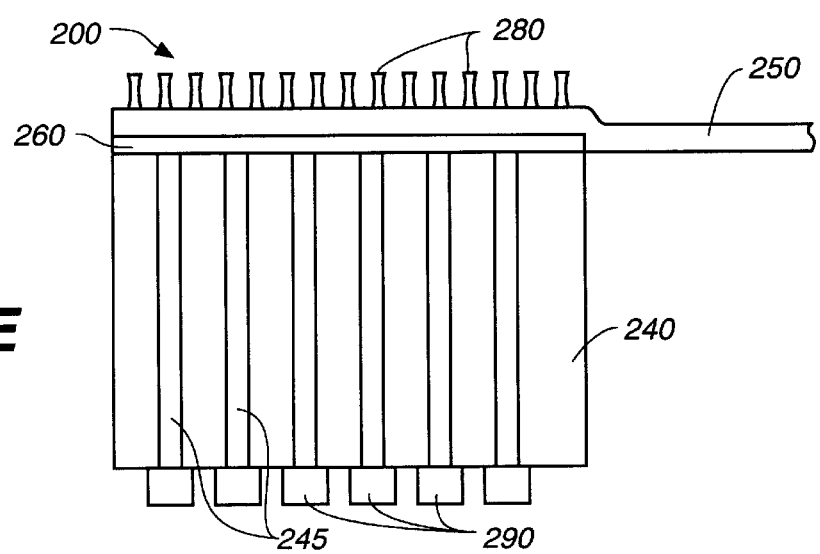
FIG._2E

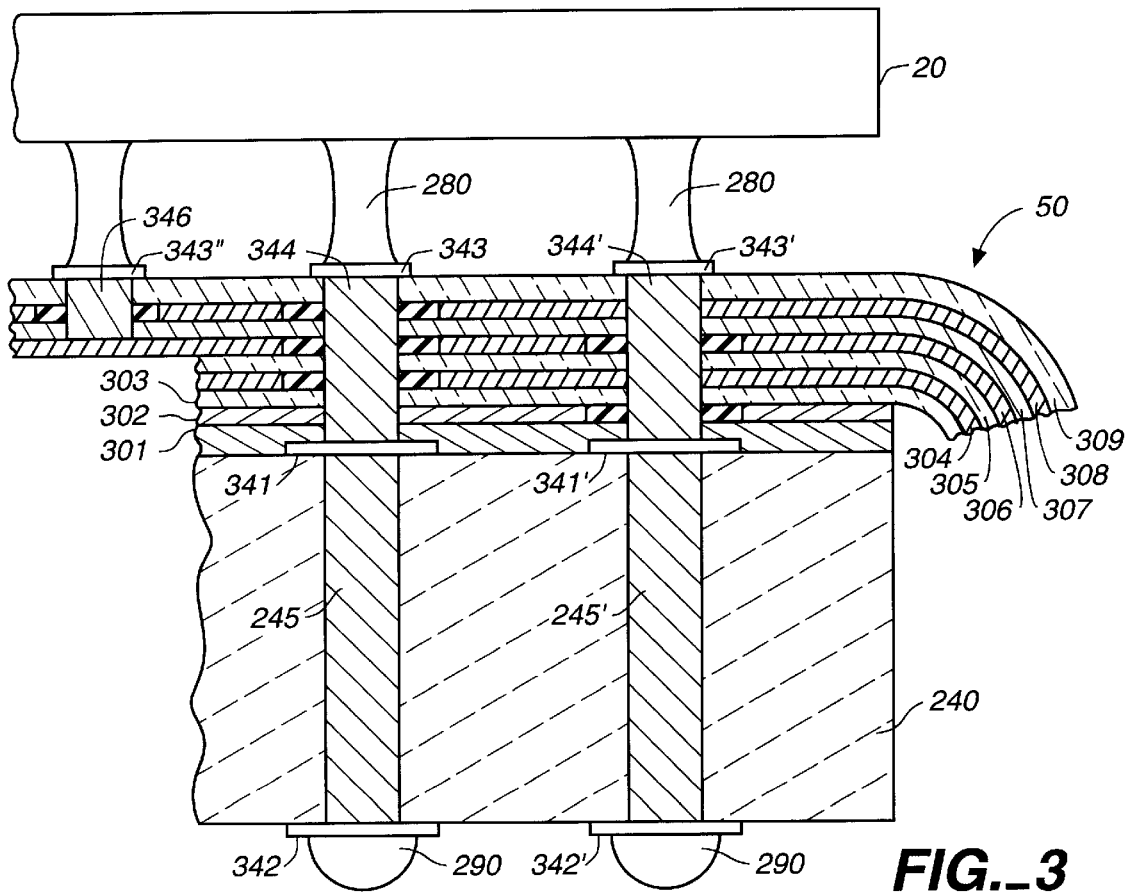
FIG._3
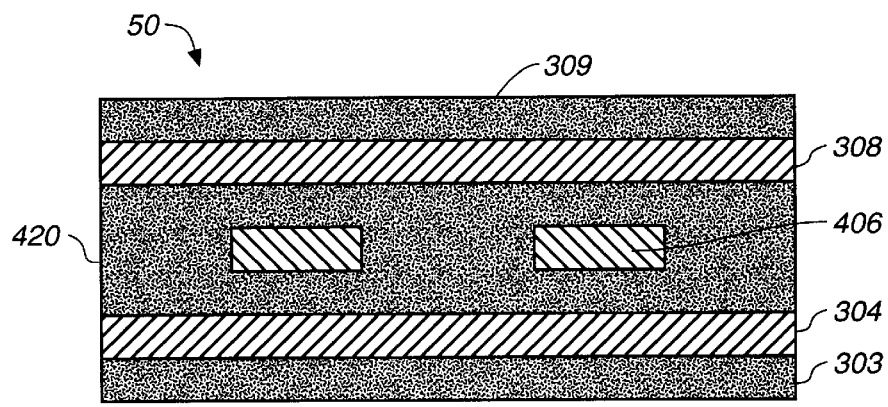
FIG._4

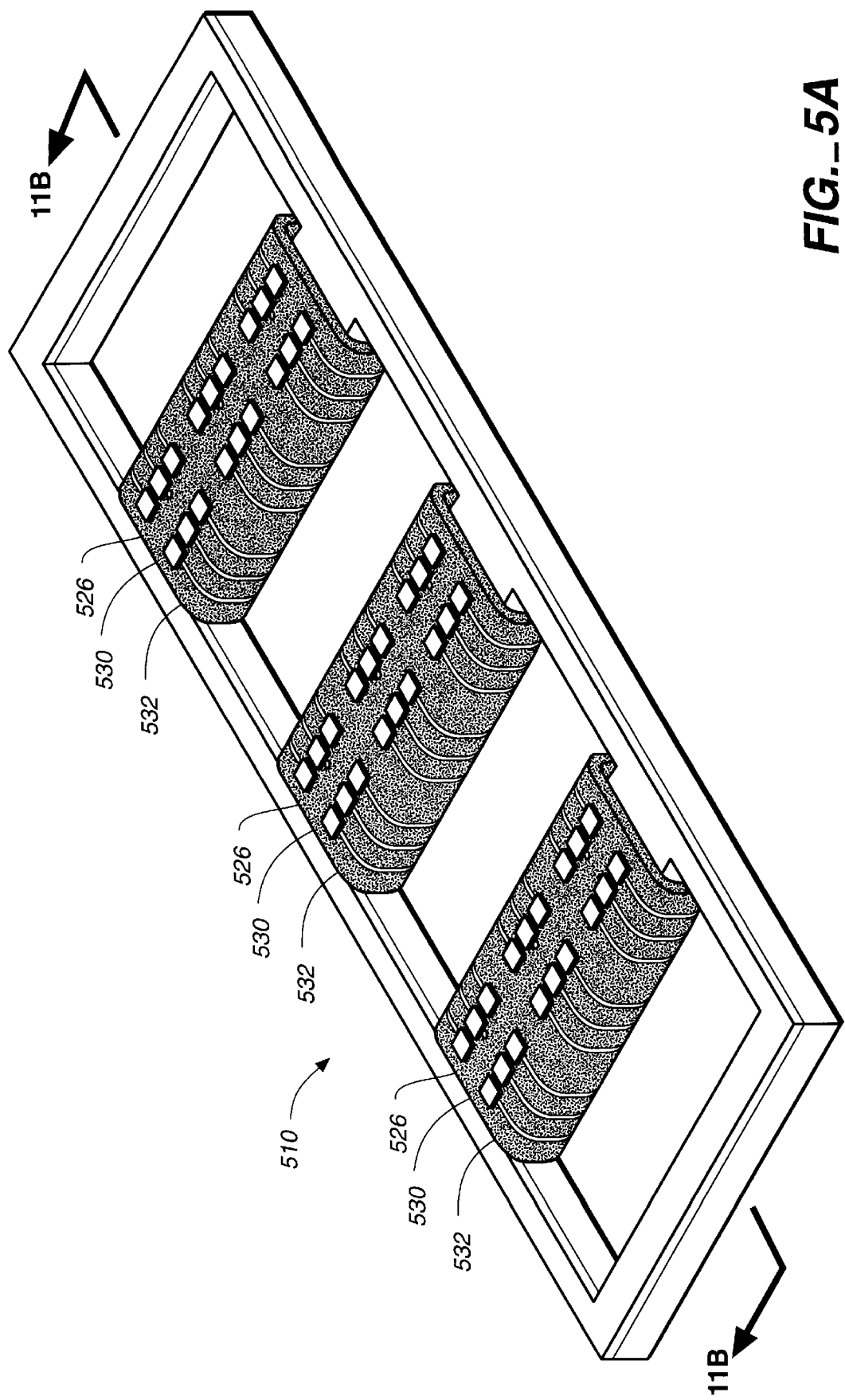
FIG._5A

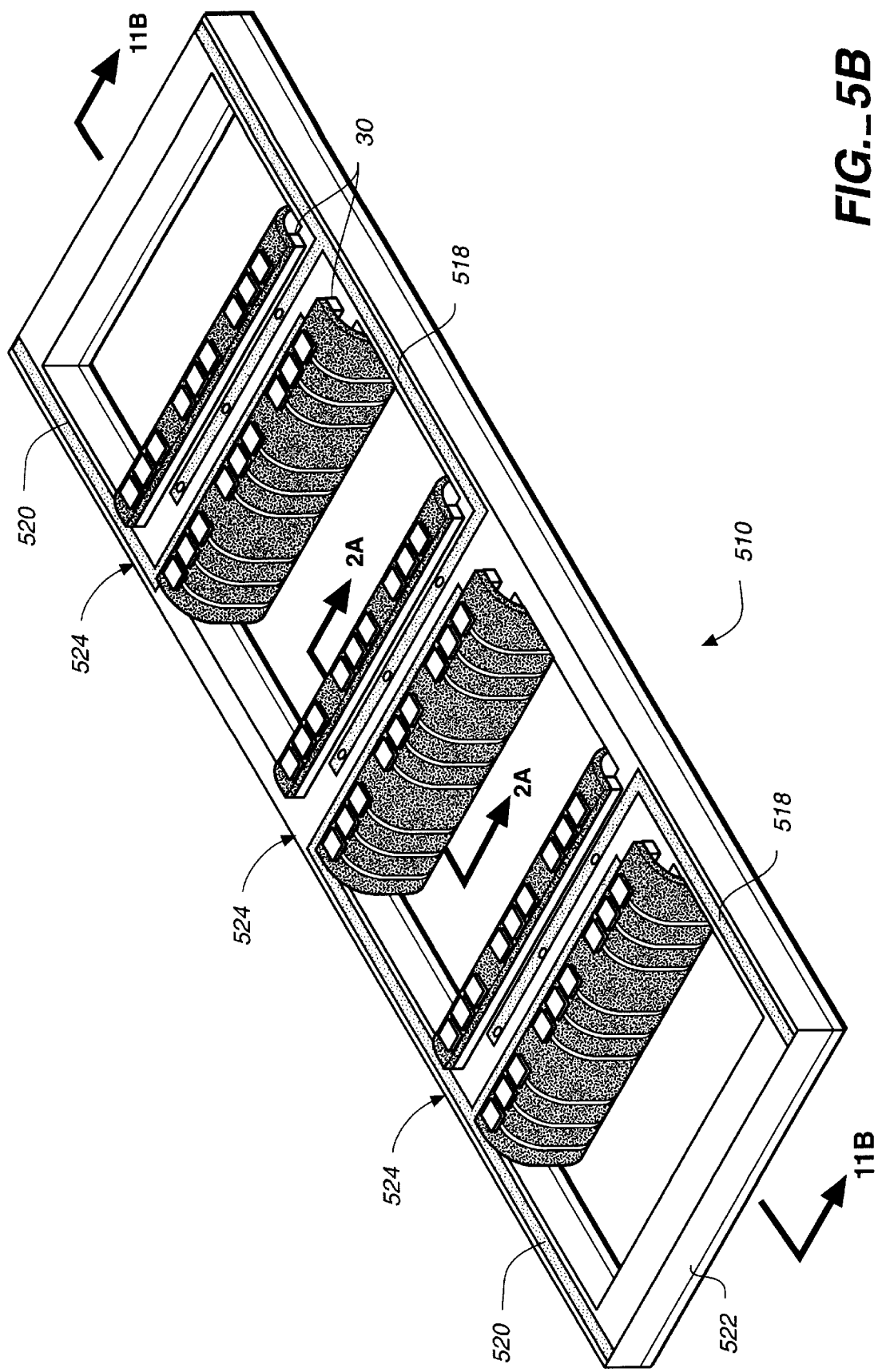
FIG._5B

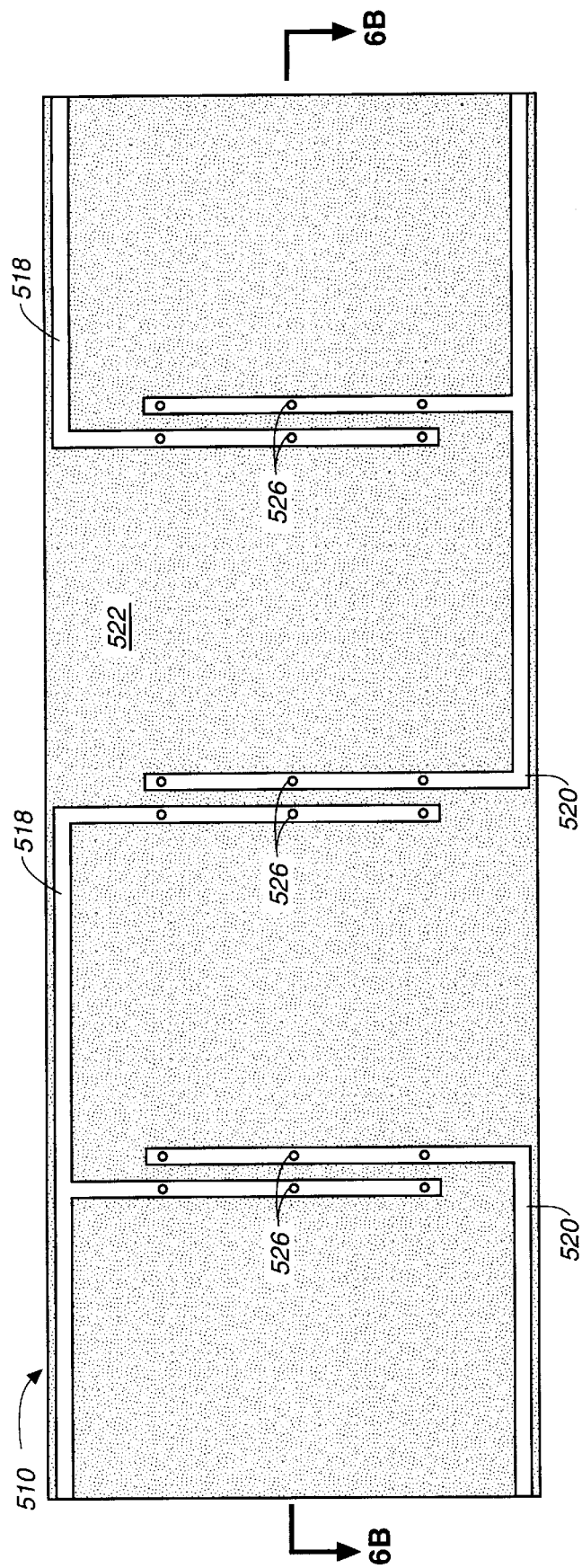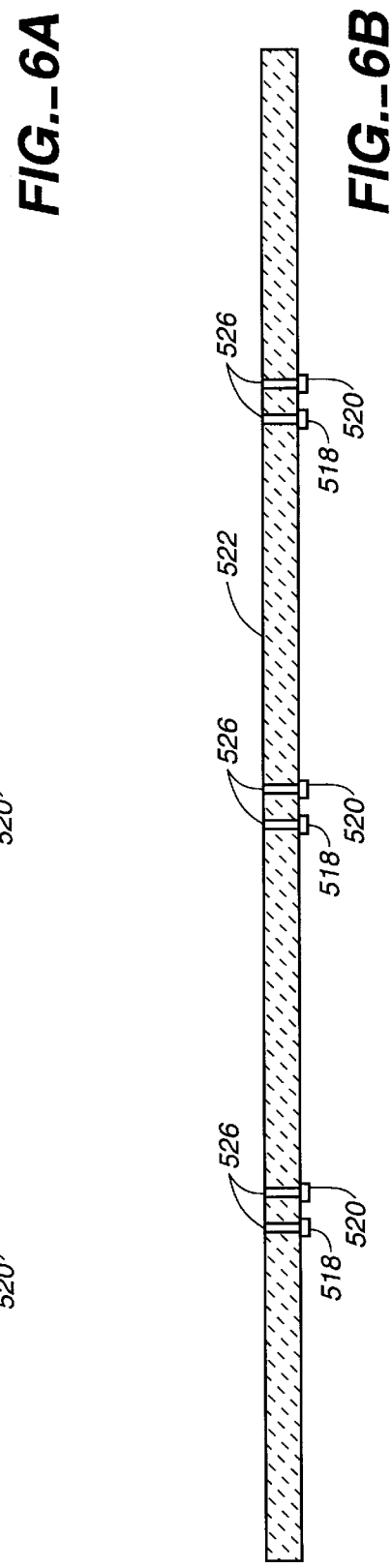

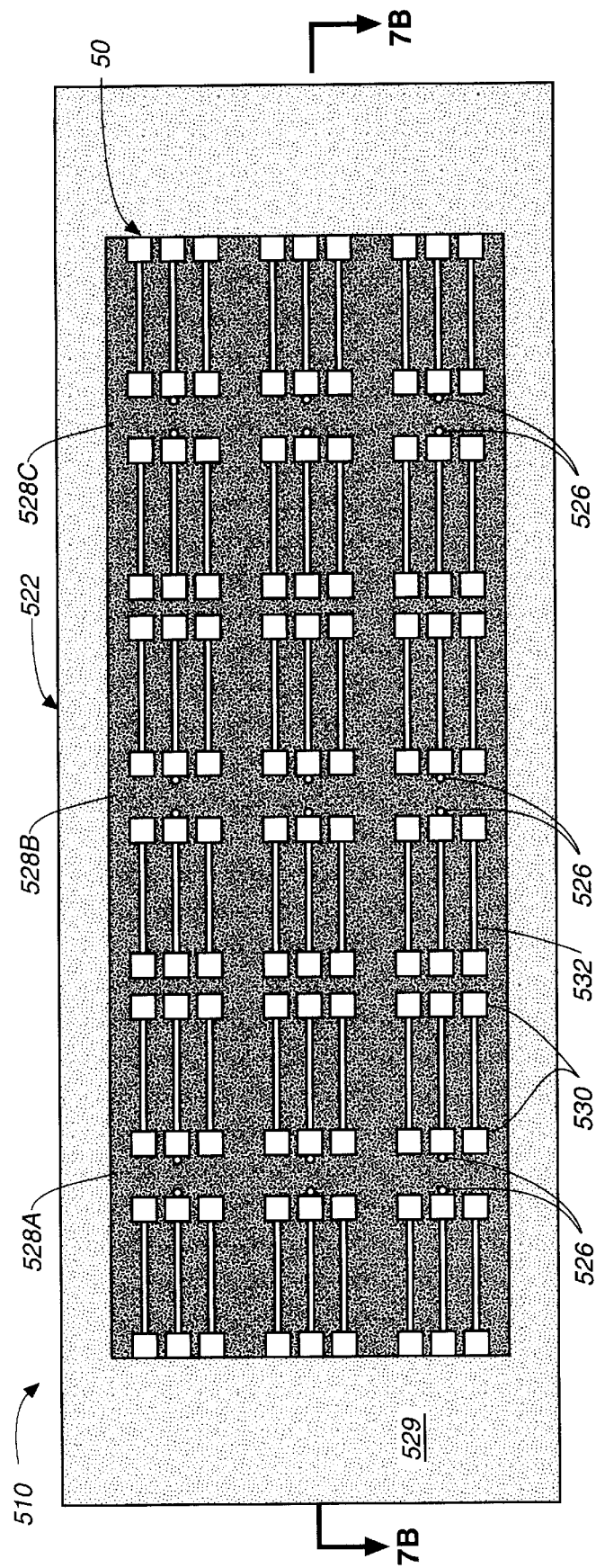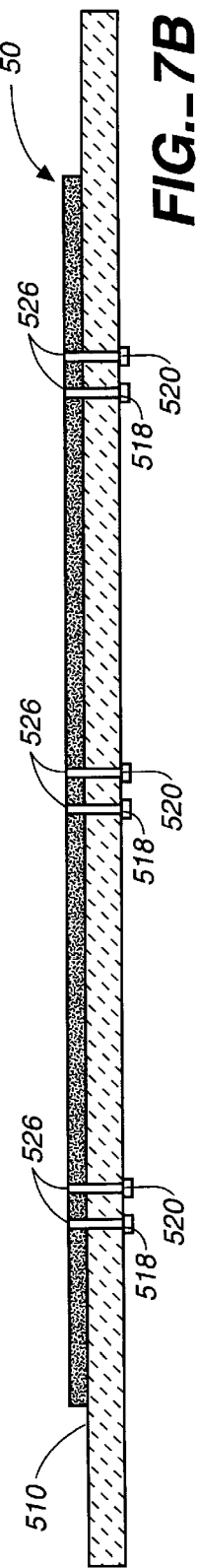
FIG._7A
FIG._7B

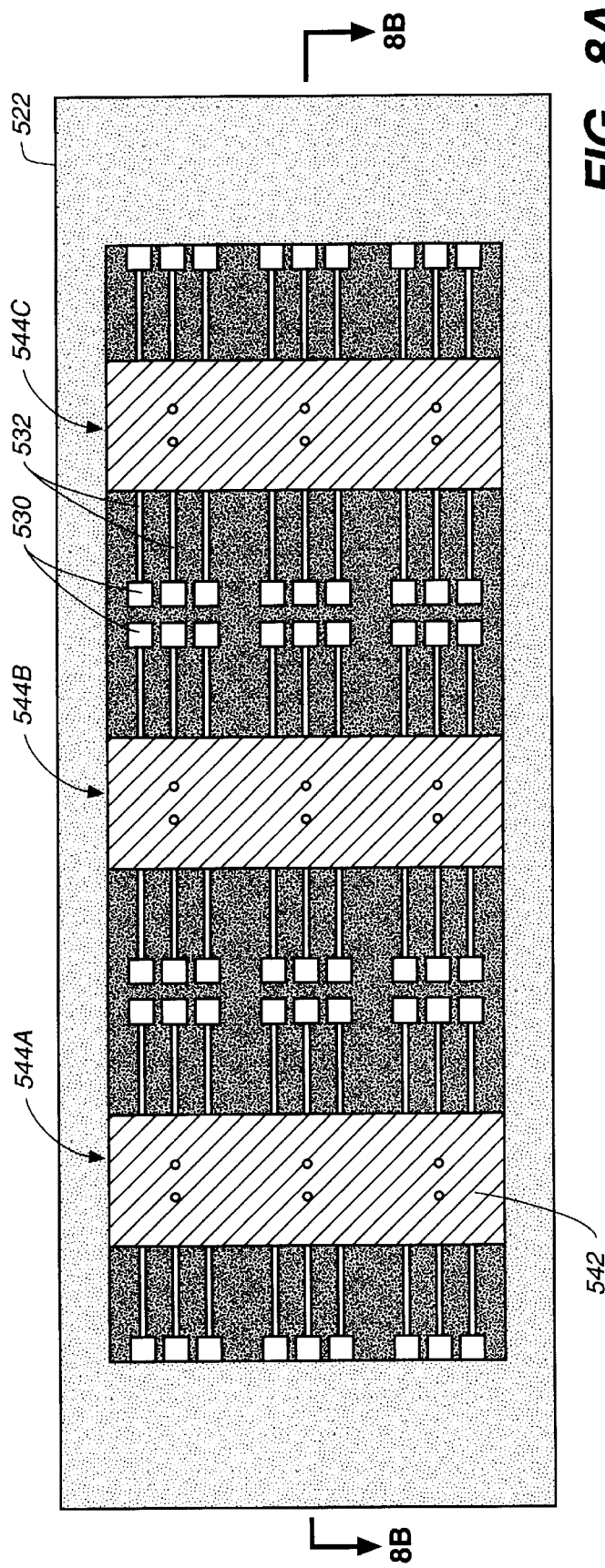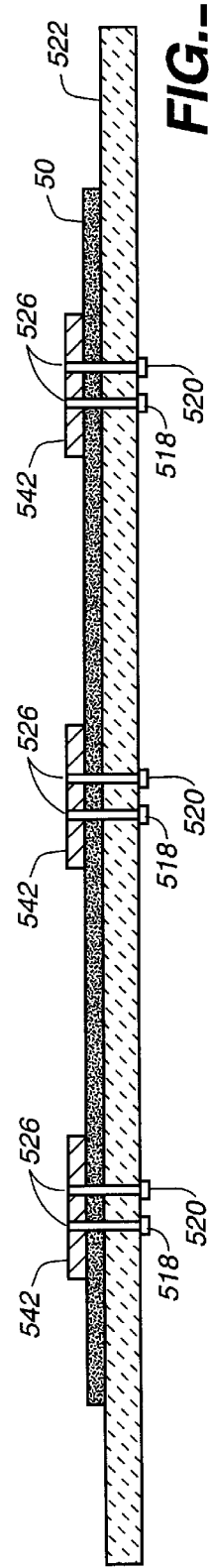

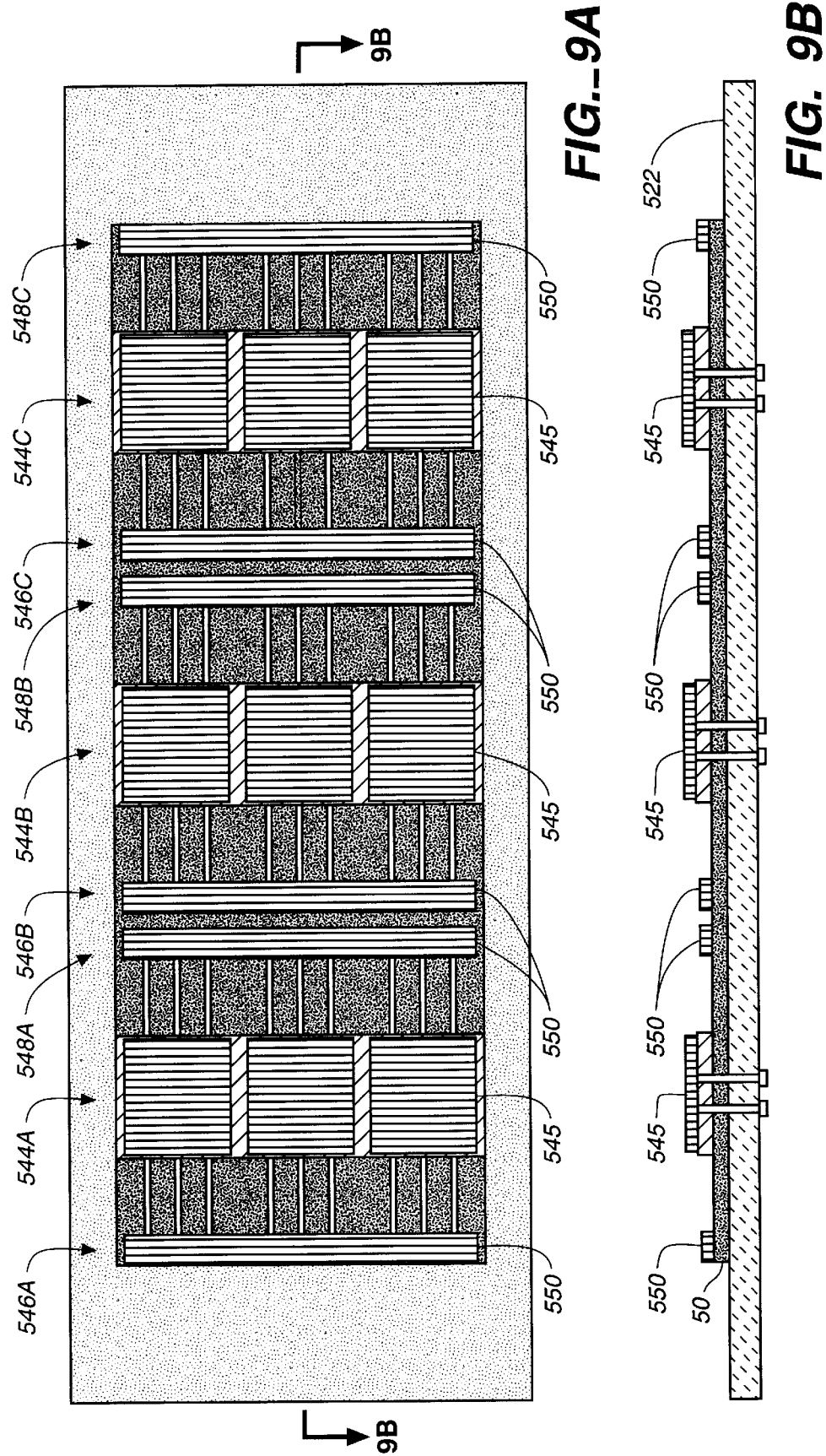

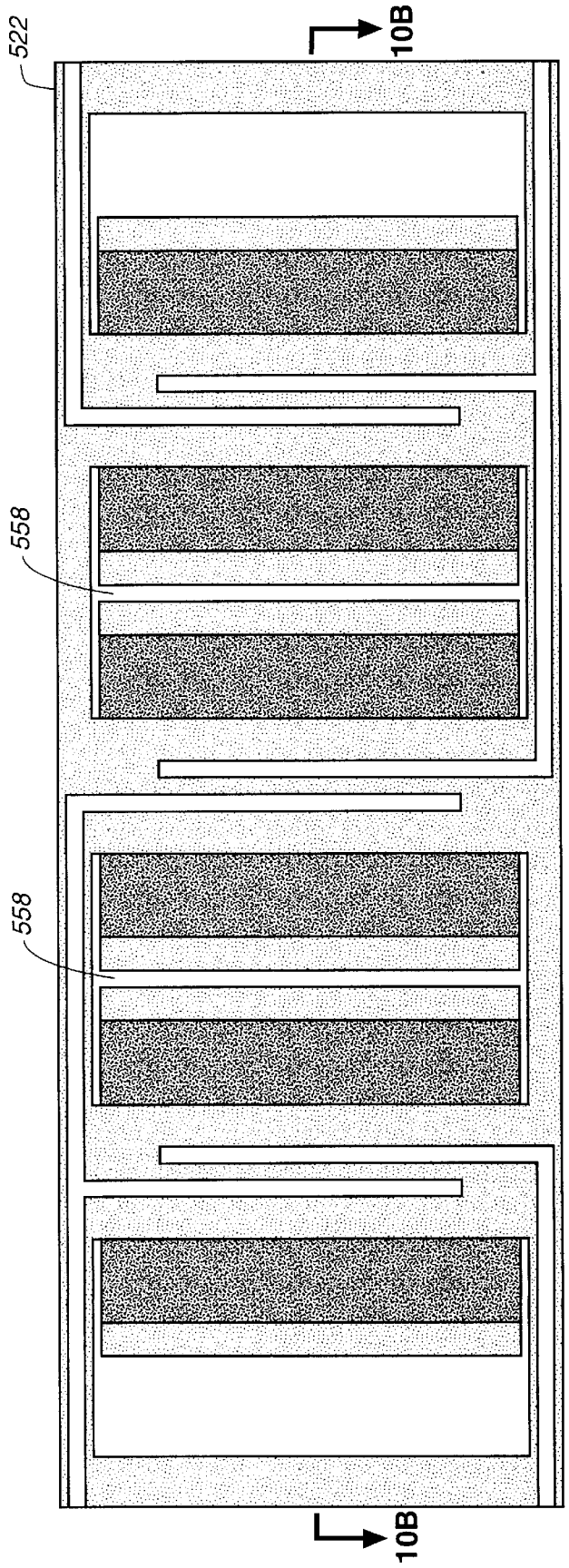
FIG._10A
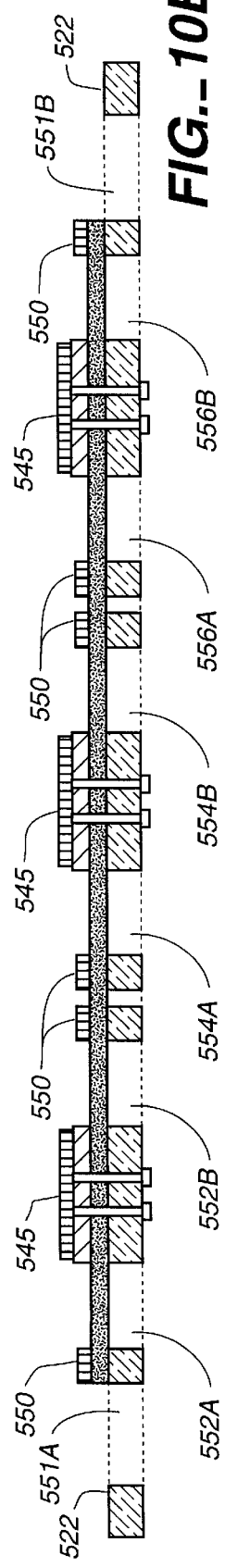
FIG._10B

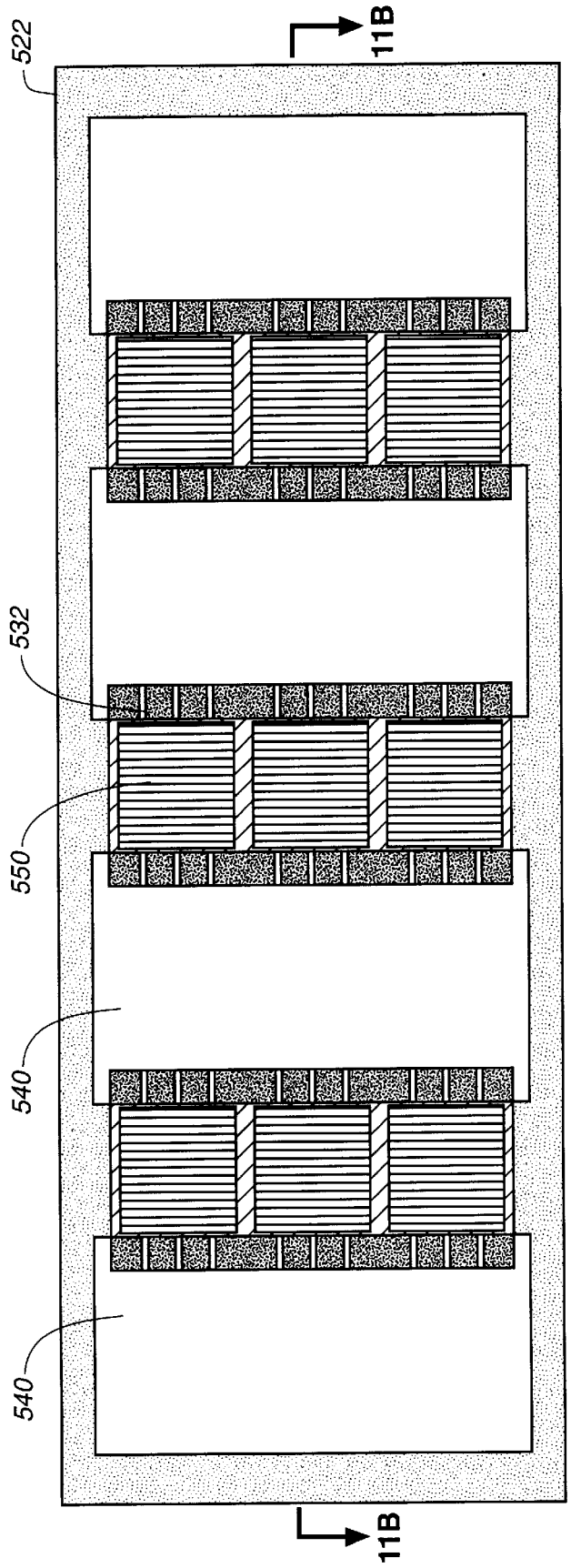
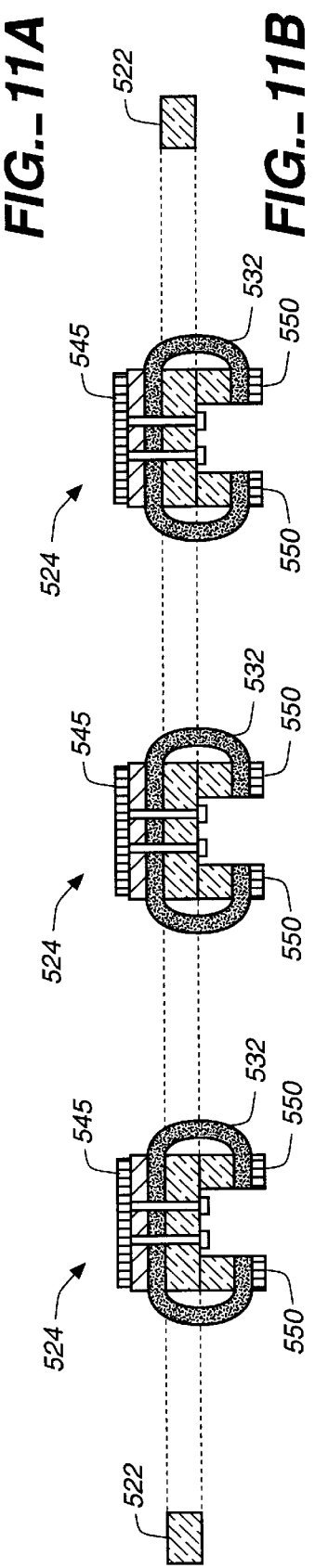
FIG.—11A
FIG.—11B

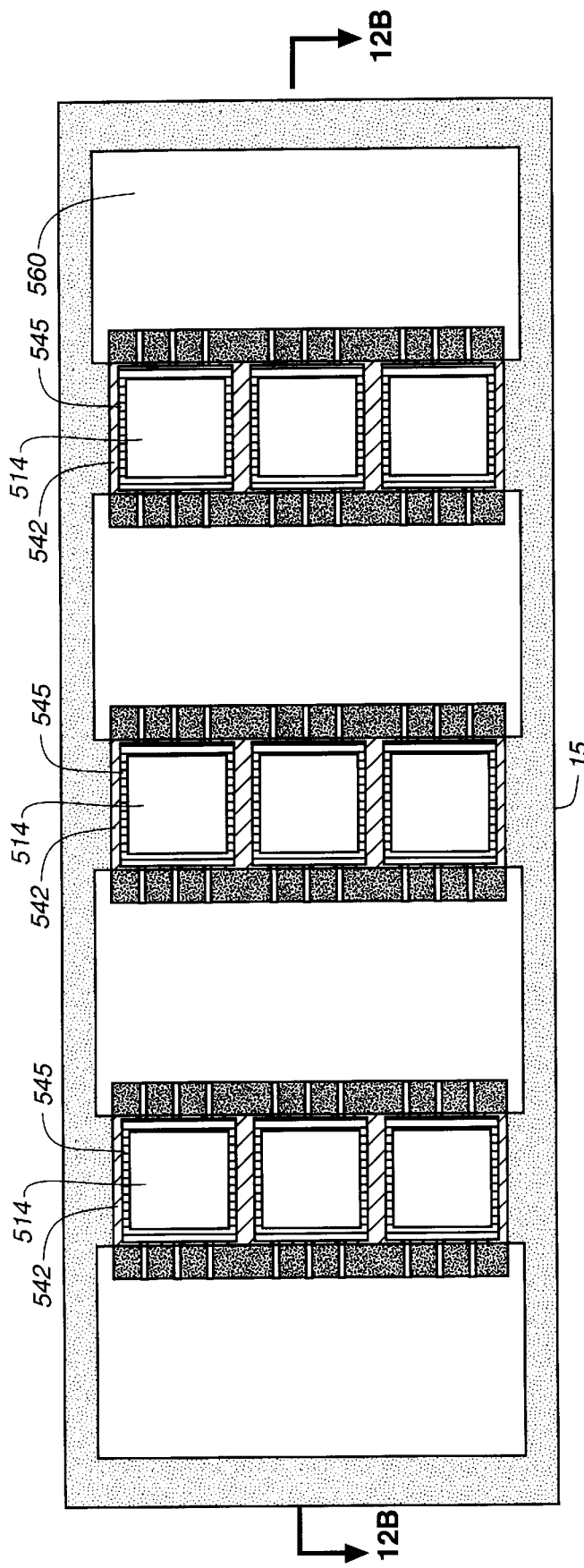
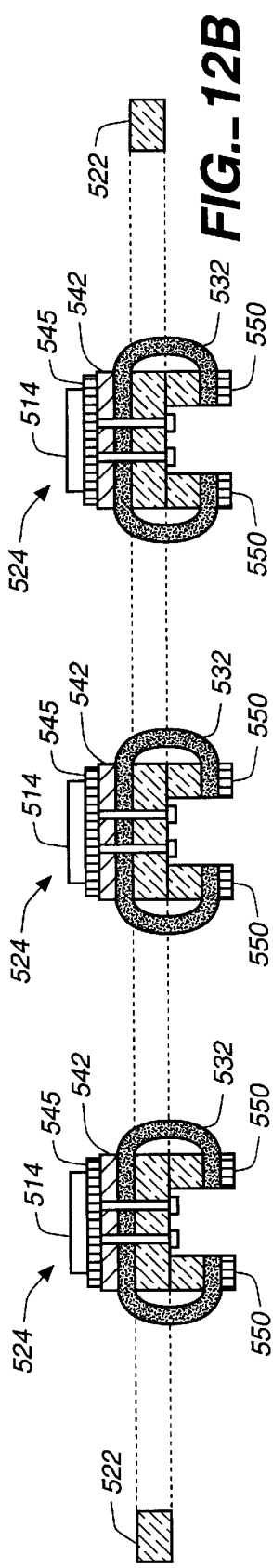
FIG.–12A
FIG.–12B

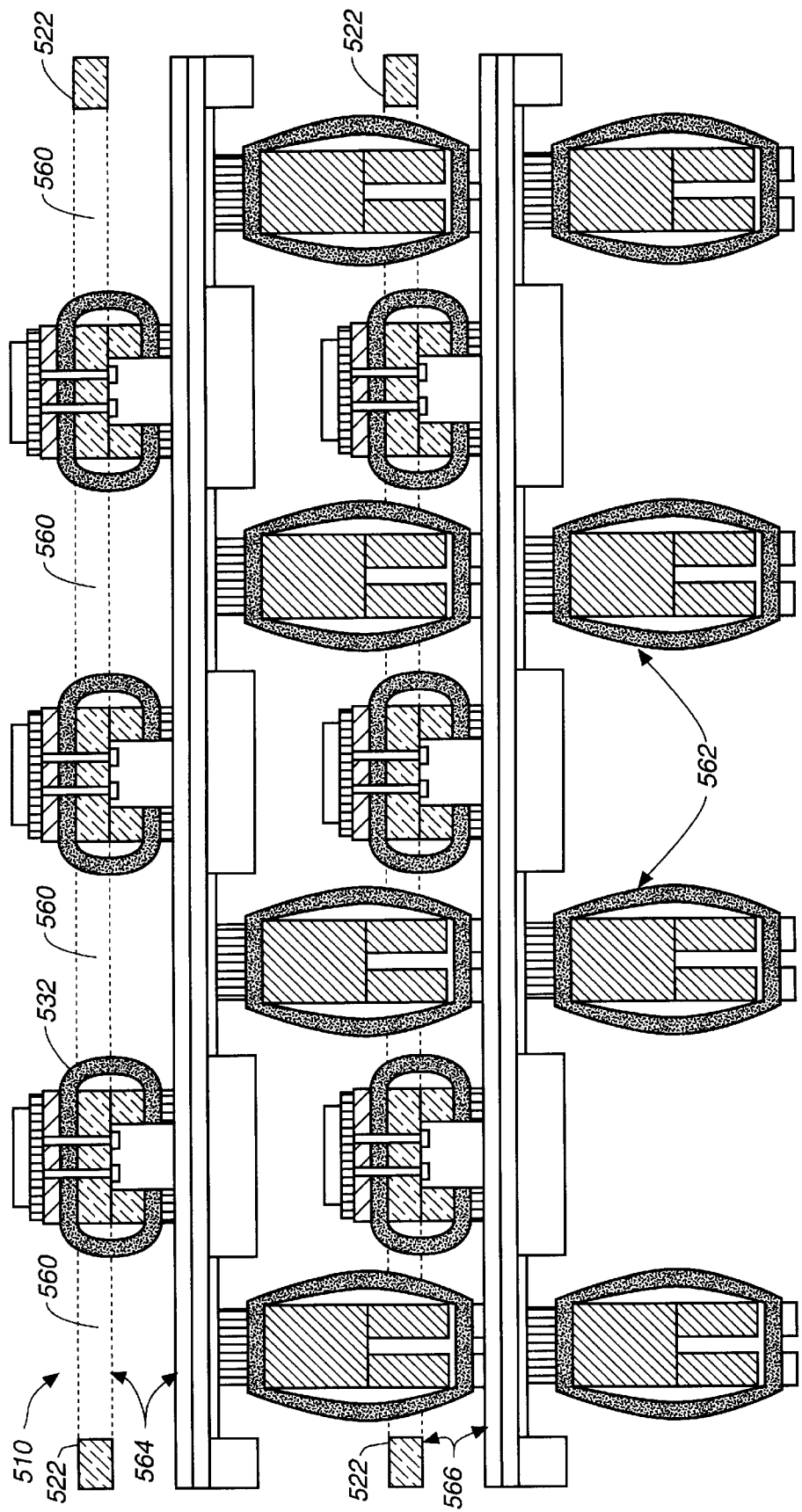
FIG._14

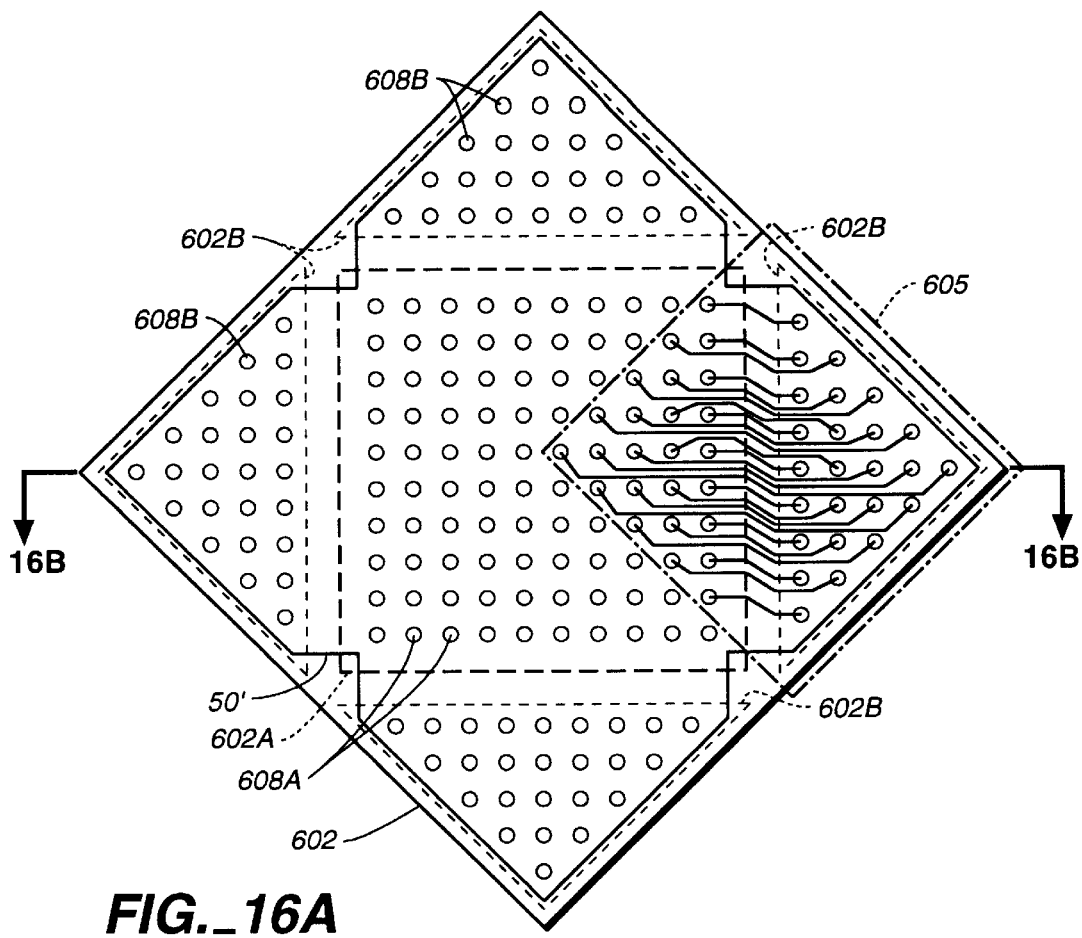
FIG._16A
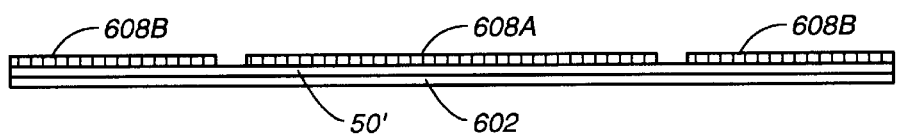
FIG._16B

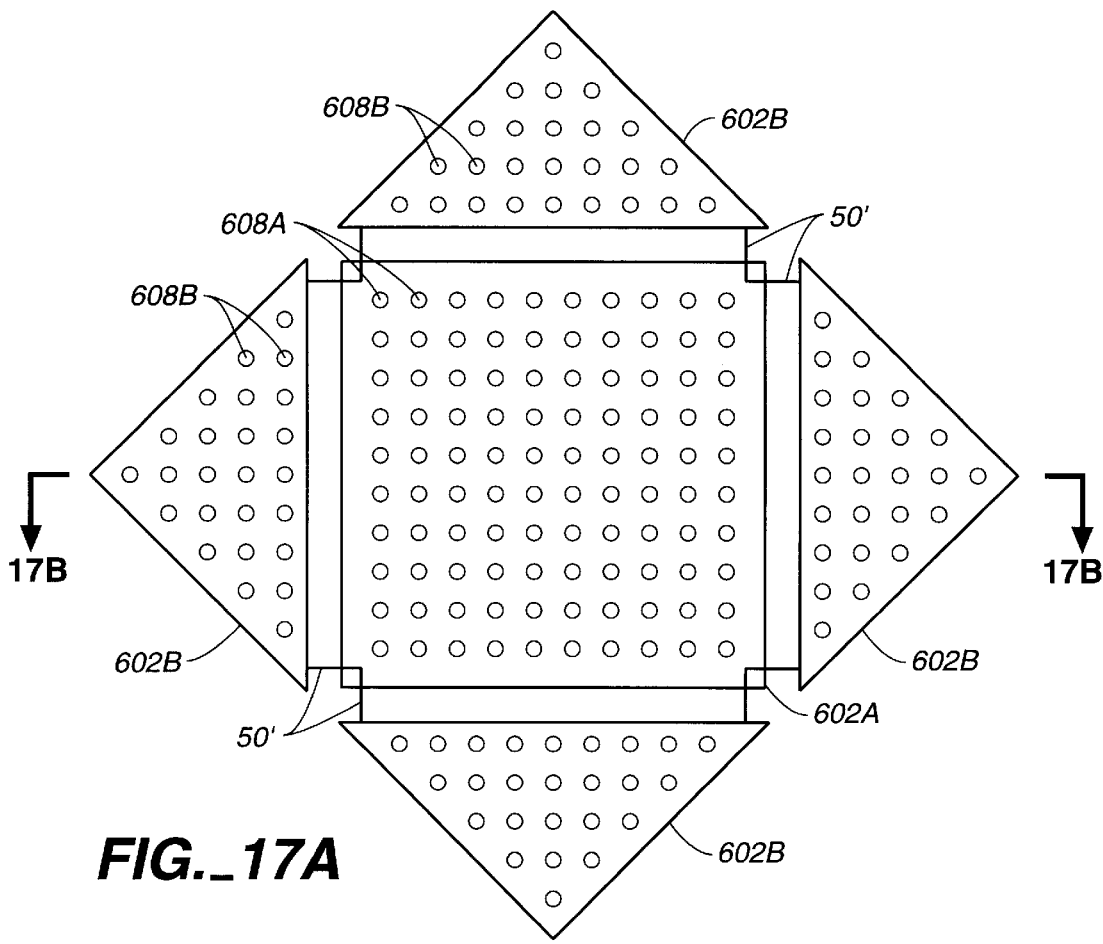
FIG._17A
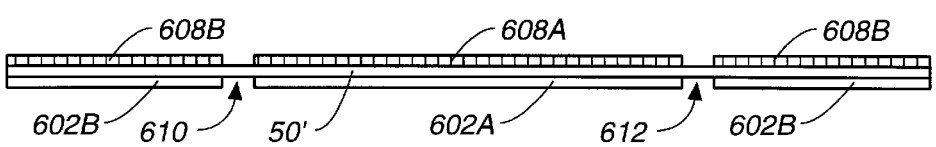
FIG._17B

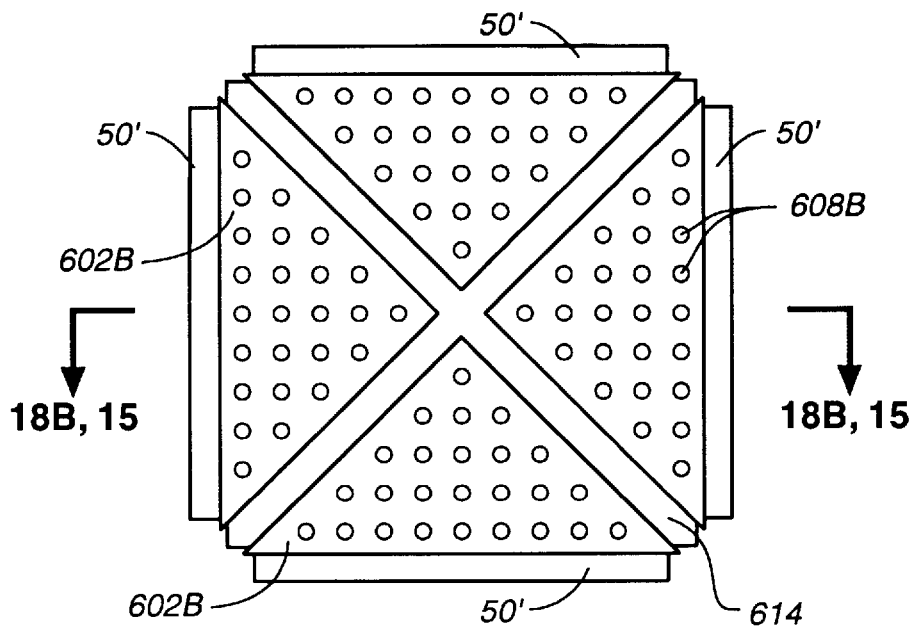
FIG._18A
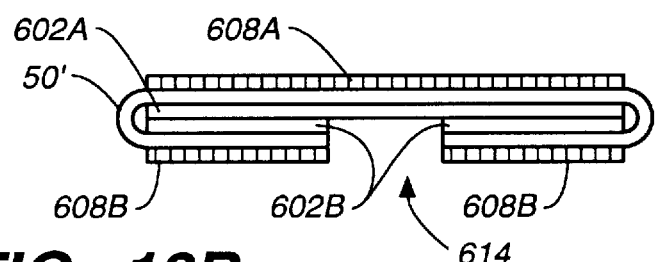
FIG._18B

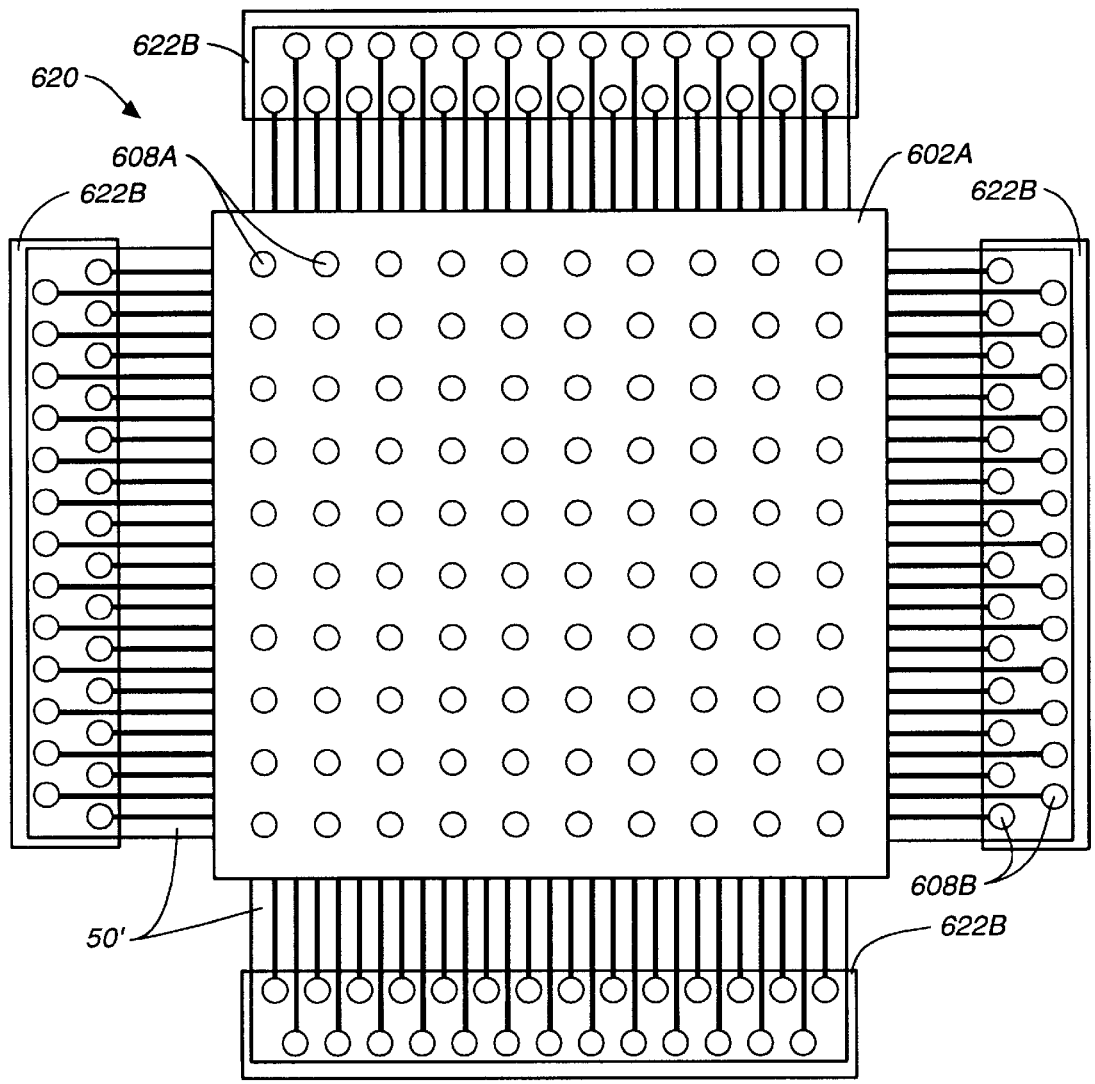
FIG._19
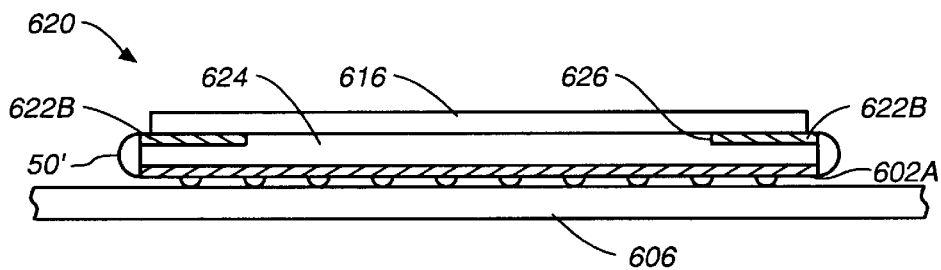
FIG._21

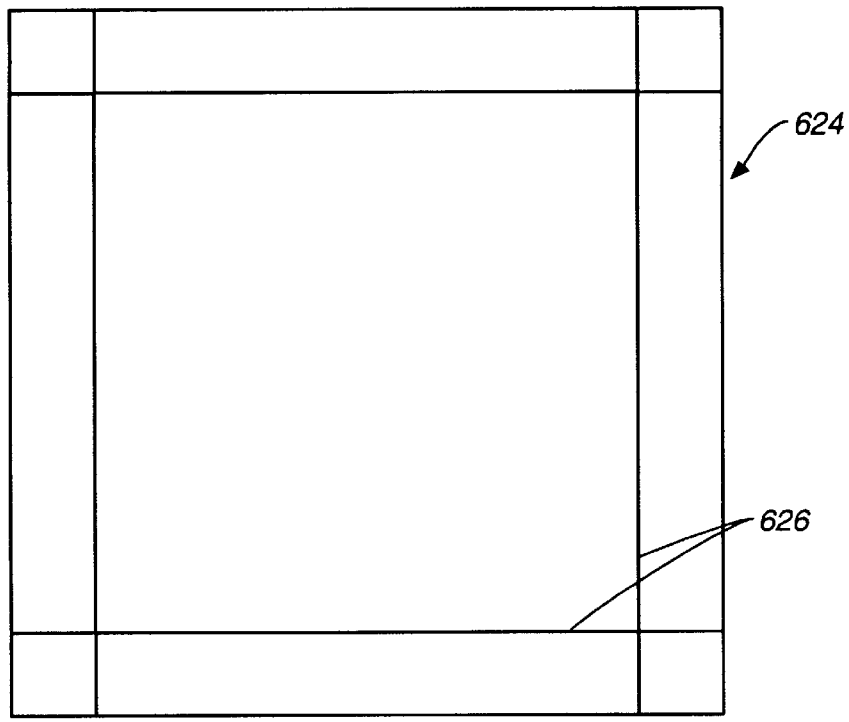
FIG._20
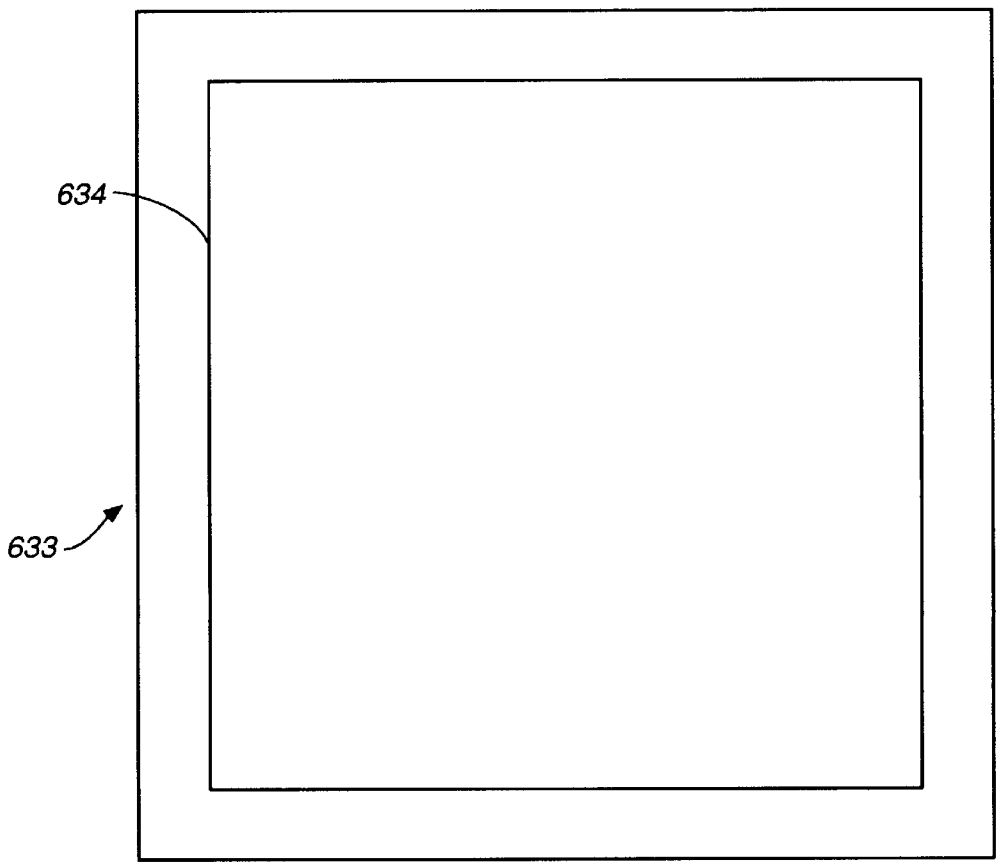
FIG._23

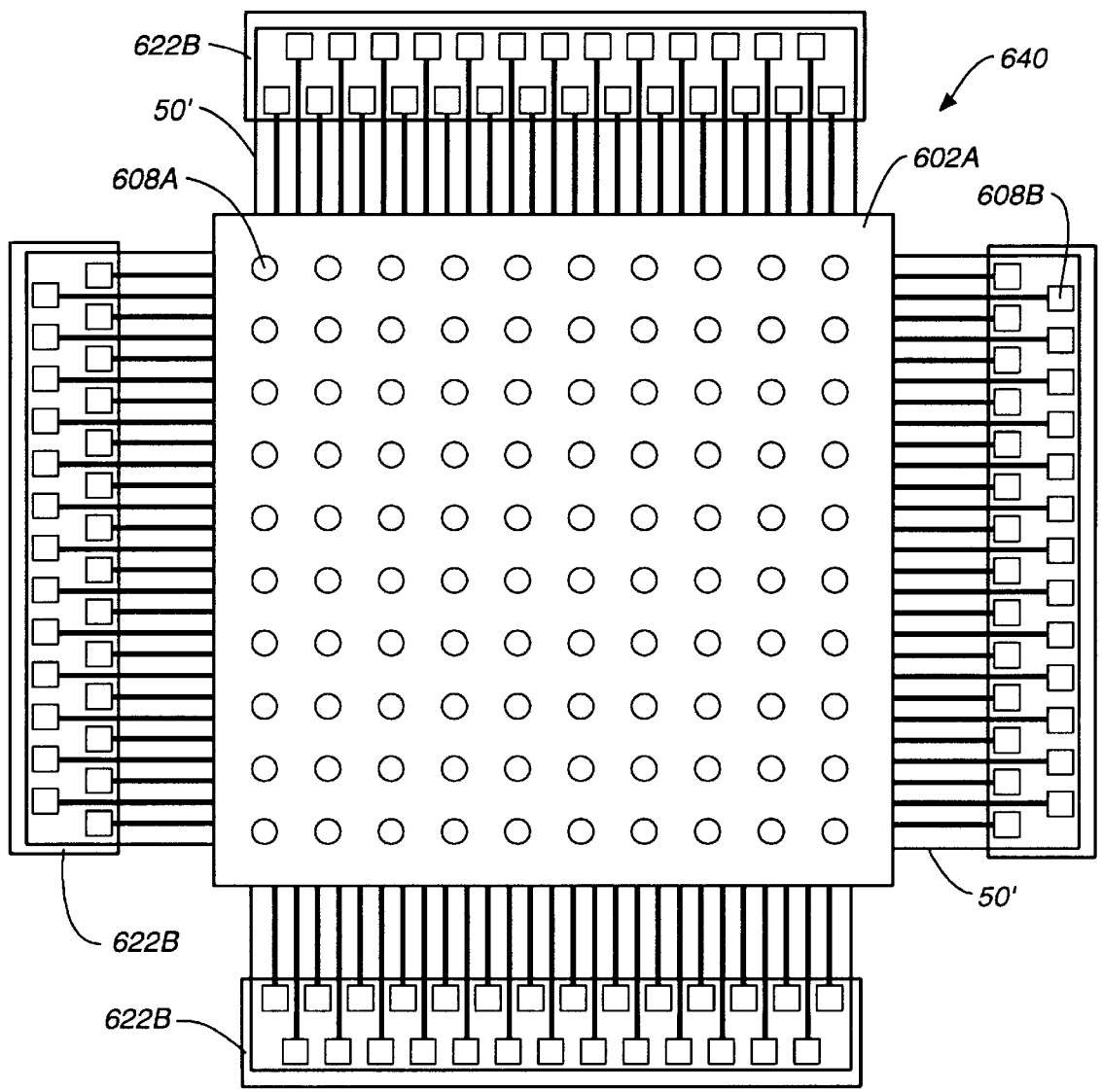
FIG._22
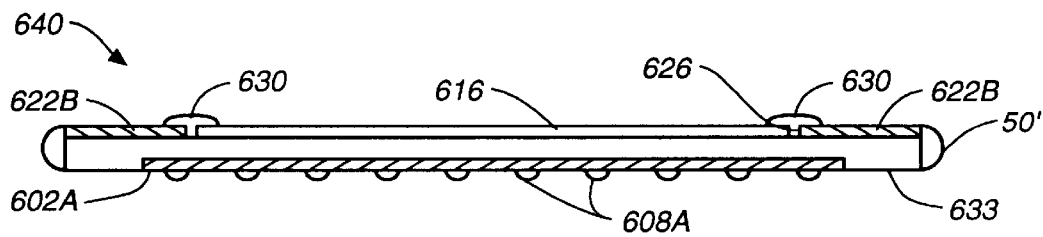
FIG._24

CONTROLLED IMPEDENCE INTERPOSER SUBSTRATE

RELATED APPLICATIONS

This application is a continuation-in-part of Ser. No. 08/274,915, entitled "CONTROLLED IMPEDANCE INTERPOSER SUBSTRATE AND METHOD OF MAKING," filed Jul. 14, 1994, abandoned which is a continuation-in-part of Ser. No. 08/157,332, entitled "THREE-DIMENSIONAL MULTICHIP MODULE," filed Nov. 22, 1993, now U.S. Pat. No. 5,426,563, which was a continuation of Ser. No. 07/925,962 filed Aug. 5, 1992, abandoned.

FIELD OF THE INVENTION

This invention is related to integrated circuit device packaging, and is particularly related to interposer substrates for mounting integrated circuit chips on a multichip module, and methods of making the same.

BACKGROUND OF THE INVENTION

Integrated circuit (IC) "chips" comprising very large numbers of electronic components have become ubiquitous in modern society. Electronic devices and components of all sorts, from central processing units used in all levels of computing, to highly specialized controllers used to control various types of equipment and machinery, are now routinely available as integrated circuit chips. Since the introduction of the first IC chips, there has been a remarkable increase in the number of devices contained on a single chip, as well as a corresponding dramatic reduction in the size of the individual electronic components formed on the chip. Device geometries with line widths of the order of one micron have become common so that individual IC chips now routinely contain in excess of a million electronic components. Even higher device densities are projected.

The increase in device complexity and the decrease in device size has, for many types of IC chips, sharply increased the complexity of forming interconnections between the chips and external devices.

Many devices, such as computers, utilize a large number of separate IC chips. For example a computer may have one or more central processing unit (CPU) chips, various memory chips, controller chips, input/output (I/O) device chips, etc. Traditionally, each chip is mounted in a separate package which is then connected to a printed circuit board, for example, a computer "motherboard," which supplies power to the chip and provides signal routing among the chips on the board and to various I/O devices. However, where an electronic device utilizes a substantial number of chips, packaging each chip separately greatly increases the total area of printed circuit board needed to interconnect all the chips. In addition, as device speed has increased, the distance between individual components has become an increasingly important factor, so that it is important, in many applications, to minimize the signal path between IC chips used in the system.

In order to overcome the aforementioned problems, many device makers have begun using "multichip modules," (sometimes abbreviated "MCM"), i.e., packages housing a plurality of individual IC chips. Typical multichip modules incorporate not only means for interconnecting the IC chips with external devices, but also means for interconnecting the IC chips within the module. A general introduction to multichip modules, including a discussion of the history of the development thereof, is described in the text entitled: *Multichip Module Technologies and Alternatives, The Basics,* D. A. Doane, et al., eds., Van Nostrand Reinhold (1993). Multichip modules significantly reduce the overall space needed to house the IC chips and, by shortening the distance between chips within the module, facilitate high speed device operation.

The first multichip modules were two-dimensional, i.e., all of the IC chips housed in the package were mounted on a planar substrate. Subsequently, three-dimensional multichip modules were developed, thereby permitting an even further increase in the density of IC chips that could be housed in a single package. However, placing a large number of high density chips in close proximity greatly complicates the task of supplying power to and routing signals to and from the chips. In view of the complicating factors associated with three-dimensional arrays, two-dimensional multichip arrays remain the most common form of multichip modules in use today.

Two major substrate technologies have developed for handling the power supply and signal routing in multichip modules. Initial multichip module designs utilized co-fired ceramic substrate technology. The trend in recent years has been a shift to "thin film" substrate technology. In some cases the two technologies have been combined to produce hybrid chip modules using both thin film and ceramic layers. In all multichip module designs a plurality of IC chips are connected to a multilayered substrate which contains the signal and power lines needed to supply power and to interconnect the chips to each other and to external devices. In order to make the required number of interconnections, such substrates are multilayered, sometimes containing dozens of individual layers. For example, even early ceramic substrate technology utilized as many as thirty-five separate layers in the multichip substrate. However, problems arise in placing signal lines in close proximity to each other and to power supply lines. The dielectric constant of the substrate material plays an important role in solving (or creating) these problems. One of the reasons ceramic technology has lost favor is due to the high dielectric constant associated with the ceramic materials typically used as a substrate material. Thin film substrates made of materials such as polyimide or other polymers have become more common due, in part, to the much more favorable dielectric properties of these materials. In addition, the processing techniques used with polyimides allow the creation of much finer structures, thereby more easily accommodating higher device densities.

It is well known that it is important and desirable to provide bypass capacitance in close proximity to the integrated circuit chips in a multiple chip module, and the need for such capacitance increases as the switching speed of the devices becomes higher. In some designs, bypass capacitance is incorporated into the multilayered MCM substrate by forming capacitor plates within the MCM substrate. This technique adds complexity to the multilayered substrate, reducing the manufacturing yield. Another approach is to mount discrete capacitors as separate components on the surface of the MCM substrate. However, this arrangement uses up valuable "real estate" on the surface of the MCM and suffers from the fact that such capacitors not as close to the IC chips as needed.

The approach of the present invention is to overcome these problems by using what will be referred to herein as an interposer substrate which is positioned between the main multilayered, MCM substrate and an integrated circuit chip. Such interposer substrates, which may incorporate embedded capacitors, are mounted on the MCM substrate, with the IC chips being mounted on the interposer substrates. This arrangement allows the bypass capacitance to be positioned extremely close to the IC chip, and increases the modularity of the overall MCM, thereby improving overall system yields and reducing manufacturing costs. The interposer substrates can be separately manufactured and tested before incorporation into a multichip module. This is especially important since the capacitor structure is one of the most likely components to be defective, due to the relatively close spacing of the plates and the possibility of pin-hole defects or other causes of electrical shorting or leakage in the thin dielectric layer between the plates. If a defective capacitor is incorporated into a MCM substrate and not discovered until fabrication of the substrate is complete, the resulting loss may be quite significant.

Interposer substrates have also been used in the past to accommodate differences in the thermal expansion coefficients between the MCM substrate and the IC chip.

High speed device operation often also requires the use of terminal resistors positioned very close to the IC chips to match impedance between the chips and the signal lines carrying data to and from the chips. As is well known in the art, close impedance matching enhances power transfer and avoids problems associated with reflections of the signals. It is likewise important that the impedance of the signal lines be controlled.

Another problem with traditional approaches to packaging IC chips in MCM's is the method used for delivering power to the chips. One aspect of this problem results from routing power lines through the same substrate utilized to carry signals to and from the chip. Equally important is the fact that the thinness of the substrates used in traditional multichip modules results in power feeds to the IC chips that have relatively high impedance. This high impedance results in undesired noise, power loss and excess thermal energy production. These same problems are applicable to routing power and signal lines though an interposer substrate.

Accordingly, an object of the present invention is to provide an interposer substrate for use in coupling integrated circuit chips to a multichip module substrate which incorporates bypass capacitance.

Another object of the present invention is to provide an interposer substrate, as above, which incorporates terminal resistors.

A further object of the present invention is to provide an interposer substrate which provides a controlled impedance signal paths for the lines carrying signals from a multichip module substrate to an integrated circuit chip.

Yet another object of the present invention is to provide an interposer substrate which substantially isolates the routing of signal lines from the routing of power lines from a multichip module substrate to an integrated circuit chip.

Still another object of the present invention is to provide a method of manufacturing an interposer substrate having the foregoing characteristics at a reasonable cost.

A further object of the invention is to reduce voltage drops in the power lines by providing a separate power plate in which the interposer substrates can be embodied.

SUMMARY OF THE INVENTION

These and other objects that will become apparent to those skilled in the art after reading this specification along with the appended drawings and claims are realized in the present invention for an interposer substrate designed for mounting an integrated circuit chip onto a multichip module. In its broad aspect, the interposer substrate of the present invention comprises a power distribution means for coupling power from the multichip module to the integrated circuit chip, and a controlled impedance signal path means for coupling signals from the multichip module to the integrated circuit chip, wherein the power distribution means and the controlled impedance signal path means are substantially isolated from each other. In one embodiment of the present invention, the interposer comprises two rigid segments that are joined together and a thin film flexible connector which runs between the upper and lower surfaces of the interposer, such that the signals do not pass through the body of the rigid interposer segments. Preferably, the power distribution means of the interposer incorporates integral bypass capacitance. The signal path means may also incorporate terminal resistors. In one preferred embodiment impedance of the signal paths is controlled using a strip line structure in the flexible connector. The power distribution means may comprise vias formed through the rigid segments or, in the case of modules using a separate power plate, power lines of appropriate thickness may be formed directly on the power plate and brought up to the chips as necessary through vias in the power plate and overlying thin film layers.

A method of making the interposer of the present invention comprises providing a base substrate having two substantially coplanar major surfaces, forming a plurality of vias in the end regions of the base substrate, forming a multilayered thin film signal path connector on one of the major surfaces of the base substrate, the thin film structure comprising a plurality of signal paths extending across the face of the substrate, removing the middle region of the substrate thereby forming two rigid segment joined by a flexible connector, folding the resulting structure and joining the rigid segments thereby coupling the vias formed in the two segments.

BRIEF DESCRIPTION OF THE DRAWINGS

FIG. 1 is an elevational view of an interposer substrate according to one embodiment of the present invention with an integrated circuit chip mounted thereon.

FIGS. 2A–2E show various stages in the fabrication of an interposer substrate according to the method of the present invention.

FIG. 3 is a detailed partial cross-sectional view of an interposer substrate according to one embodiment of the present invention.

FIG. 4 is a partial cross-sectional view of the flexible connector of the present invention.

FIGS. 5A and 5B are isometric views of the top and bottom, respectively, of a power plate according to the present invention.

FIGS. 6A through 12B illustrate the successive steps in the fabrication of the power plate, the suffix A in each figure denoting a plan view of the power plate at a given step, and the suffix B denoting a sectional view of the power plate at that step;

FIG. 14 is a stylized sectional view of a three-dimensional IC chip assembly using the power plates and signal modules of this invention;

FIGS. 10A through 19 illustrate the successive steps in the fabrication of the power plate, the suffix A in each figure denoting a plan view of the power plate at a given step, and the suffix B denoting a sectional view of the power plate at that step.

FIG. 15 is a cross-section view of third embodiment of an interposer substrate according to the present invention.

FIGS. 16A through 18B illustrate the successive steps in the fabrication of the interposer embodiment shown in FIG. 15, those figures having a suffix A denote plan views of the interposer at given steps, and those figures having a suffix B denote cross-section views of the power plate at the given steps.

FIG. 19 is a top plan view of a fourth embodiment of an interposer substrate according to the present invention.

FIG. 20 is a top plan view of an alignment frame according to the present invention.

FIG. 21 is a cross-section view of the interposer embodiment shown in FIG. 19 with the alignment frame shown in FIG. 20.

FIGS. 22 through 24 illustrate a fourth interposer embodiment according to the present invention suitable for wirebond connection of the IC chip.

DETAILED DESCRIPTION

Figure 13:
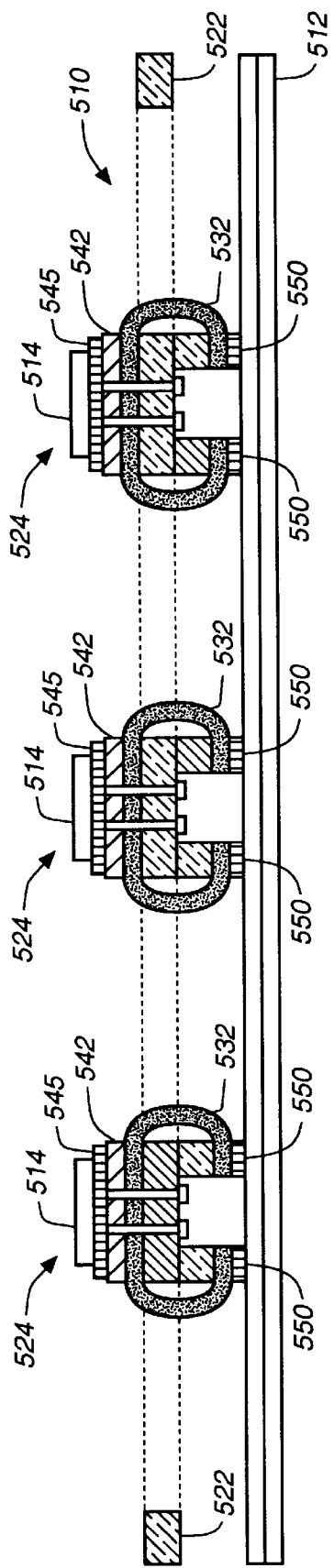
FIG. 13 is a sectional view similar to FIG. 12B but the assembly of the completed power plate with the signal module.

The present invention is directed to an interposer substrate for mounting an integrated circuit ("IC") chip onto a substrate, and is particularly useful for mounting an IC chip to a multichip module ("MCM") substrate. Although the present invention is described in the context of an interposer used to mount a single chip onto a substrate, those skilled in the art will recognize that the interposer substrate of the present invention could also be used to mount more than one chip onto a substrate. Likewise, although the present invention is described in the context of mounting an IC chip onto a multichip module substrate, those skilled in the art will recognize that the present invention could be used in connection with other types of electronic devices and other types of substrates.

Interposer substrates may be used for a variety of reasons, primarily to provide bypass capacitance and terminal resistors in very close proximity to an IC chip, and to mitigate any mismatch between the coefficients of thermal expansion ("CTE") of an IC chip and the substrate it is mounted upon. As has been described, forming bypass capacitors and terminal resistors on interposer substrates not only places them in very close proximity to the IC chip, but also reduces the complexity of the MCM substrate that would otherwise have to incorporate these devices. Reducing the complexity has the direct effect of enhancing the manufacturing yield.

FIG. 1 shows a interposer substrate 10 according to one embodiment of the present invention. In FIG. 1 an IC chip 20 is shown mounted on the interposer substrate 10 in flip chip fashion, using a plurality of wire interconnects 25. Interposer 10 has not yet been mounted on a substrate, but is shown with a plurality of solder bumps 15 for such purpose. For purposes of the present invention, any method of mounting chip 20 onto substrate 10 and for mounting substrate 10 to an MCM may be used. Flip chip mounting is generally preferred since it affords the highest density of connections between the IC and the interposer. Solder bumps and wire interconnects are generally used in flip chip bonding, with wire interconnects offering the greatest density of connections.

Allowed U.S. Pat. Application Ser. No. 07/977,571 entitled *Wire Interconnect Structure For Connecting an Integrated Circuit to a Substrate,* now U.S. Pat. No. 5,334, 804, the disclosure of which is incorporated by reference, and which is coassigned herewith, discloses a unique wire interconnect structure, and method of manufacturing the same, for connecting IC chips to substrates. The wire interconnect structure is presently preferred by the inventors for use with the present invention due to the fact that the technology has proven to provide a very high density of highly reliable interconnects. An interposer substrate, in accordance with the present invention, allows all of the wire interconnects to be fabricated on interposer. Without an interposer, the wire interconnects would have to be fabricated either on the MCM substrate or on the chip itself. In either case there is a risk of damaging the structure that the wire interconnects are fabricated on. The interposer substrates of the present invention are lower value than either IC chips or MCM substrates, thereby lowering the cost associated with defective wire interconnect fabrication.

In the preferred embodiment, interposer 10 comprises two substantially identical rigid segments 30 and 40, each of which contains a plurality of vias running through it (FIG. 3). Segment 40 is mounted on segment 30 using interconnects 35, such as wire interconnects or solder bumps. Interconnects 35 electrically connect one end of each via in segment 30 with an end of a corresponding via in segment 40 such that electrical paths are created through interposer 10 from the lower surface of segment 30 to the upper surface segment 40. As explained in greater detail below, these electrical paths through the rigid segments form the power distribution means of the present invention and are used to convey supply voltages and a ground reference from the MCM substrate to the IC chip.

A separate flexible connector 50, described in greater detail below, is attached to the upper surface of rigid segment 40 and the lower surface of rigid segment 30, forming a link therebetween. Flexible connector 50 provides a controlled impedance signal path between the upper and lower surfaces of interposer 10, thereby isolating the signal paths from the power distribution means. Some of interconnects 25 and 15 are used to electrically couple flexible connector 50 with IC chip 20 and with the MCM substrate, respectively. The remaining interconnects 25 and 15 are used to electrically couple IC chip to the power distribution means. Thus, according to the present invention, power is routed through the interposer substrate, comprising rigid members 30 and 40, while the signal paths are routed through the flexible connector 50. Isolating the power distribution means from the signal path means substantially eliminates problems of cross-talk, simplifies the substrate structure, and enhances control of the signal path impedance. In addition, it allows for a direct, low impedance path for the power supply and a controlled impedance path for the signal lines.

As shown and described in connection with FIGS. 2B and 3, one or more bypass capacitors are formed on one or both of the rigid segments and coupled to the power distribution system. Likewise, terminal resistors may be formed on a surface of a rigid segment and coupled to the signal paths. Thin film resistors are preferably fabricated on top of the thin film structure. The resistor material should be chosen such that the resistor's stabilization temperature does not degrade the thin film structure. Nichrome resistors may be used because their stabilization temperatures are typically less than about 350° C.

Turning to FIGS. 2A–2E, a method of making the interposer substrate of the present invention is shown. FIG. 2A shows a cross-sectional view of a rigid substrate 200 used to fabricate the interposer of the present invention. The substrate has been lapped, chemical/mechanical polished or otherwise processed to have coplanar major surfaces and has two end portions 230 and 240. A plurality of vias 235 have been formed in end portion 230 and a corresponding plurality of vias 245 have been formed in end portion 240. As depicted in FIG. 2A, the central region 205 of rigid substrate 200 has been partially removed. It is not necessary to remove any of the central region 205 of rigid substrate 200 at this stage. Eventually, the entire central region of the rigid substrate will be removed, and early partial removal, particularly if the substrate is ceramic, is preferred since it minimizes the risk of damage to the structure formed on the substrate as processing goes forward.

Substrate 200 may be any suitable rigid material such as ceramic or silicon. Both ceramics and silicon are widely used in the electronics industry and have well developed processing technologies associated with them. If a ceramic material is used, via holes may be punched or laser drilled and then filled with conductive material, as is well known in the art. If a silicon substrate is used, standard patterned etching techniques may be used, in addition to the above mentioned methods, to form holes in the substrate which may be filled using standard metallization techniques, such as sputtering, plating or CVD/MOCVD deposition.

FIG. 2B shows a portion of the interposer, primarily end region 240 at a later stage of fabrication. At this stage, capacitor structure 260 is formed on the upper surface of end region 240 and is connected to vias 245. A more detailed depiction of a capacitor structure suitable for use in connection with the present invention is shown in FIG. 3 and is described in connection therewith. Standard thin film technology may be used to form capacitor structure 260. If additional bypass capacitance is required a similar capacitors may also be formed on the upper surface of end region 230 and on the lower surfaces of both end regions. Likewise, capacitor structure 260 may comprise a multiplate structure to increase the surface area of the capacitor plates and thereby the capacitance. One capacitor plate of capacitor structure 260 is electrically connected to vias supplying the ground reference and other plates to vias furnishing each of the supply voltages. Optionally, capacitor structure 260 may include embedded terminal resistors, or such resistors may be formed within or, preferably, on top of the end portion of a thin film connector 250, described below. Although the capacitor structure is shown as being separate from flexible connector 250 (FIG. 2C), it may be integrated within the connector as shown in FIG. 3 and described below. However, formation of separate capacitors allows the capacitors to be tested and defective capacitors isolated before further processing.

FIG. 2C shows the next step in fabrication, comprising the formation of a multilayered thin film connector 250. Connector 250 extends over substantially the entire rigid substrate 200, including the central region 205 thereof, and contains the signal paths for coupling data signals from the MCM substrate to the IC chip. In addition, at its ends connector 250 comprises vias for electrically coupling vias 245 and 235 with the upper surface of the connector, (see FIG. 3). The materials selected to form connector 250 are flexible at the thicknesses used. In the preferred embodiment, connector 250 comprises alternating layers of a polyimide or other suitable organic polymer such as benzocyclobutene, and patterned layers of a conductive material such as copper or gold. Preferably, the copper layers are coated with chromium or another material which promotes adhesion to the polyimide. As described in greater detail below, the layers are configured to provide signal paths having a controlled impedance. Methods for forming and patterning suitable copper and polyimide layers are well known to those skilled in the art and need not be described.

In FIG. 2D interconnects 280, 290 have been added to the upper surface of connector 250 and to the lower surface of substrate end region 240, respectively. For exemplary purposes, interconnects 280 are depicted as wire interconnects and interconnects 290 are depicted as solder bumps. Methods of making the wire interconnects shown are described in the aforementioned U.S. Pat. No. 5,334,804. While only an illustrative number of interconnects 280, 290 are shown for exemplary purposes, there will be a greater number of interconnects 280 on the upper surface of multilayered thin film connector, than interconnects 290 on the lower surface of substrate end region 240. This is due to the fact that interconnects 290 are used only for supplying power and ground potentials to the chips, whereas interconnects 280 are used for supplying power and ground potentials, as well as the signal lines which are not routed through the rigid substrate.

In FIG. 2E, the remainder of the central region 205 of the rigid substrate 200 is removed, as by etching, laser ablation, sandblasting or milling, leaving only the connector 250 between end regions 240 and 230. Since connector 250 is flexible, this allows structure to be folded so that the bottoms of the two remaining rigid portions, i.e., 230 and 240, may be joined using interconnects 290. After folding and joining, the resulting structure is as shown in FIG. 1.

FIG. 3 illustrates in greater detail the multilayered flexible connector 50 and a capacitor structure previously described. A portion of rigid segment 240 is shown with two vias 245 and 245', each of which provides an electrically conductive path between the two surfaces of segment 240. Bonding pads 341, 342, 341' and 342' are formed on the opposing surfaces of the rigid segment at the ends of the respective vias.

A first dielectric layer 301 is deposited over the upper surface of rigid segment 240, and is then pattern etched to form via holes to allow electrical connection through the dielectric layer to bonding pads 341 and 341' respectively. The via holes are then filled with a conductive material to form a portion of vias 344 and 344', and a first patterned conductive layer 302 is deposited over the surface of the first dielectric layer. Conductive layer 302 forms one plate of a capacitor structure and is electrically connected to vias 240 and 344 which are used to carry a supply voltage potential. Via 344', which carries a ground reference potential, is electrically isolated from conductive layer 302, as shown.

Thereafter, a second dielectric layer 303 is then deposited over conductive layer 302 and is pattern etched to create via holes at appropriate locations. In the embodiment of FIG. 3, dielectric layer 303 extends over the entire area of the rigid substrate, thus forming the bottom layer of flexible connector 50 when the central region of the substrate is removed, as described above. A second conductive layer 304 is then deposited over second dielectric layer 303 and pattern etched to provide isolation from via 344. As shown, conductive layer 304, which serves as the second plate of the capacitor structure, is electrically connected to vias 245' and 344' which carry a ground reference potential. Conductive layer 304 extends over the entire rigid substrate and forms a portion of controlled impedance flexible connector 50, serving as a ground plane therein.

A third dielectric layer 305 is then deposited on top of conductive layer 304 and is patterned to form holes for vias 344 and 344'. A third conductive layer 306 is then deposited on top of dielectric layer 305 and patterned to isolate it from vias 344 and 344'. Third conductive layer 306 is the signal path layer and is electrically connected to via 346. For exemplary purposes only one via 346 is shown. In an actual embodiment, there will be a large number of electrically isolated signal paths within conductive layer 306, each of the signal paths being connected by at least one via 346 to the surface of the interposer structure. It is noted that via 346 does not extend downward from layer 306 because the signal paths are routed though the flexible connector and not through the rigid segments.

A fourth dielectric layer 307 is deposited over conductive layer 306 and pattern etched to form holes for vias 344, 344' and 346. A fourth and final conductive layer 308 is deposited over dielectric layer 307 and pattern etched to electrically isolate layer 308 from vias 344 and 346. Conductive layer 308 which is held at ground reference potential, is connected to via 344. Conductive layer 309 forms a part of flexible connector 50.

A fifth and final dielectric layer 309 is then formed over the entire structure and pattern etched to form via holes. Bonding pads 343, 343' and 343" are then formed at the upper ends of vias 344, 344' and 346, respectively, and wire interconnects 280 and solder bumps 290 are formed on the bonding pads. After the structure is folded and joined in the middle, as described in connection with FIG. 2E, IC chip 20 is mounted to the wire interconnects, as shown in FIG. 3.

While FIG. 3 shows the structure formed on one of the interposer rigid segments, substantially the same structure is also formed on the other rigid segment, although it may not be necessary to incorporate capacitor plates into both rigid segments. As described in connection with FIG. 2C, the multilayered structure is preferably formed over the entire surface of a rigid substrate before the substrate is divided into two segments. As previously described, thin film terminal resistors may also be fabricated on the surface of the thin film structure.

Preferably, the dielectric layers of the structure shown in FIG. 3 and described in the preceding paragraph are fabricated from a polyimide or other suitable organic polymer such as benzocyclobutene, and the conductive layers are fabricated from copper or other suitable metal. As noted, methods of depositing and patterning such materials are well known. For illustrative purposes, exemplary vias 346, 344 and 344' are shown as unitary structures extending through multiple layers. However, from the above description it will be apparent that such vias may be composite structures, with a portion of each via being formed as each layer is fabricated. Alternatively, vias may be formed extending through several layers at once, after multiple layers have been deposited. Likewise, although the vias through the various layers are shown overlying each other to form one long continuous via, it is also possible to for a via in one layer to be offset but electrically coupled to a corresponding via in another layer. This is useful where it is desired that there be an offset in position between, for example, via 240 and bonding pad 343. Although the structure shown in FIG. 3 has only a single supply voltage, those skilled in the art will recognize that multiple supply voltages can easily be supplied by the addition of further layers. Likewise, although the thin film capacitors are shown underlying the signal layers, those skilled in the art will appreciate that the thin film capacitors may also be formed over the signal layers.

FIG. 4 is a view of the flexible connector of the present invention taken across a cross section that is parallel to an edge of segment 40. This cross-sectional view is, thus, orthogonal to the cross-sectional view of FIG. 3. FIG. 4 shows the strip line structure of the connector of the present invention, wherein a plurality of substantially identical, parallel strips 406, formed during the patterning of conductive layer 306, are sandwiched between two ground reference planes formed from conductive layers 304, 308. The signal paths are spaced apart from the ground reference layers by dielectric layer 420 which is formed from third and fourth dielectric layers 305 and 307. The electrical behavior of such a structure, including its controlled impedance properties, are well known in the art. While two signal lines are shown in FIG. 4 for illustrative purposes, in an actual embodiment there will be a large plurality of such signal lines. The dimensions of the signal lines and the thickness of the dielectric can be selected to control the impedance of the signal lines to the desired value. The relative thicknesses shown in the figures are selected for clarity and should be understood to be only for illustrative purposes.

In accordance with another aspect of the invention, the separation of power and signal traces in three-dimensional high-density interconnect modules is more efficiently accomplished by providing a separate power plate which carries the power lines, and from which the interposer structures are formed. This construction allows the formation of relatively thick, low-resistance power and ground lines on the edges of the power plate substrate, where they are well spaced from the signal line connections to the chips. Power and ground connections to the chips may be easily accomplished through vias in the power plate and the overlying thin film layers hereinafter described.

An exemplary power plate according to the present invention is illustrated at 510 in FIGS. 5A and 5B, which are perspective views of the top and bottom, respectively. Power plate 510 comprises a substrate 522 and a plurality of interposer structures 524 that are integrally formed with substrate 522. The top surfaces of interposer structures 524 (FIG. 5A) are preferably for coupling to IC chips, and the bottom surfaces thereof (FIG. 5B) are preferably for coupled to a module substrate that interconnects the IC chips to other components in the system. Each interposer structure 524 preferably comprises a plurality of controlled-impedance signal lines 532 and connector pads 530. These structures are similar in construction to the structures 10 of FIG. 1, but they are preferably formed in this embodiment from portions of the power plate 510 rather than as separate structures.

In order to simplify the visual presentation of FIGS. 5A and 5B, a small number of signal lines 532 and pads 530 are shown. In typical applications of the present invention, the number of signal lines 532 ranges between 50 and 1,000, with two pads 530 per signal line. In those embodiments where signal lines 532 comprise strip lines, additional pads 530, typically ranging between 50 and 2,000, couple ground and/or power potentials to the ground planes of the strip lines (e.g., planes 304 and 308 in FIG. 4).

A cross-sectional view of an application of power plate 510 is shown in FIG. 13. A plurality of IC chips 514 are attached to the top surfaces of the plate's interposer structures 524. The bottom surfaces of the interposer structures 524 are attached to a signal module 512. Signal module 512 carries the signal lines that interconnect the integrated circuit chips 514 with each other and with the outside world.

Referring back to FIGS. 5A and 5B, depending upon the nature of the chips 514 and the position of the interconnections between the signal lines 532 and the chips 514, a plurality of power and ground lines 518, 520 may be formed on the top or bottom (or on each, or partly on each) of the power plate substrate 522, or even incorporated into the substrate 522. For the purposes of the following discussion, however, it will be assumed that the power and ground lines 518, 520 are formed on the underside of the power plate 510 as shown in FIG. 5B. Power lines 518 and ground lines 520 are fed through the plate's substrate 522 to the IC chips at appropriate locations. There is at least one power feed and one ground feed per chip (as shown in FIG. 5B). In preferred embodiments, there are several power feeds and several ground feeds per IC chip.

The fabrication of the power plate 510 of this invention is illustrated in FIGS. 6 through 14. Referring to FIGS. 6A and 6B, power lines 518 and ground lines 520 are first formed on an appropriate rigid insulating substrate 522. At appropriate locations, the power lines 518 and ground lines 520 are brought to the upper surface of the substrate 522 through vias 526 formed in the substrate 522. There is at least one power via 526 and one ground via 526 per chip (as shown in FIGS. 6A and 6B), and preferably several power vias and several ground vias per IC chip.

In the next step (FIGS. 7A and 7B), thin film connector layers such as the controlled-impedance flexible connector structures 50 of FIG. 3 are formed in the central portions 528A, 528B and 528C, which are surrounded by the rim portion 529 of the power plate 510. As part of the signal line layout in the connector structure 50, connector pads 530 are formed in the thin film connector layers. A connector pad 530 is formed at each end of a controlled-impedance line 532. The vias 526 that provide power and ground to the IC chips are extended through these thin film connector layers.

As shown in FIGS. 8A and 8B, thin-film capacitor or capacitor-resistor layers 542 may optionally be formed on top of flexible connector structure 50 in the central parts 544A, 544B, 544C of the power plate portions 528A, 528B and 528C respectively. The capacitor layers are coupled to the power/ground vias 526, and distribute the power and ground potentials to appropriate locations on the top surfaces of the interposer structures 524 where these potentials may be coupled to the IC chips. The resistor layers couple selected signal lines to either the power or ground potential through resistive material. The resistive material provides controlled amounts of resistance, typically 50 ohms, between the selected signal lines and power/ground. Some applications may not require capacitors or resistors. If capacitors are not required, one or more metalization layers may be used to route the power and ground potentials to the appropriate locations. It may be appreciated that each of the capacitor and resistor component layers may be formed within the interior of the substrate.

FIGS. 9A and 9B show the formation of a plurality of interconnect structures 545 and 550, which are formed in arrays in preferred embodiments of the present invention. Interconnect structures 545 are disposed on the left and right parts 546A, 548A, 546B, 548B, 546C and 548C of the power plate portions 528A, 528B and 528C. Wire interconnect structures 550 are disposed on the central parts 544A, 544B and 544C where the chips 514 will eventually be placed. For visual simplicity, the arrays of structures 545 and 550 are shown in the figures as layers with striped interiors. Structures 545 and 550 may comprise any of the well known interconnect technologies, including pads with C4 solder bumps or BIP connectors. In preferred embodiments, structures 545 and 550 comprise wire interconnects of the type described in the aforementioned U.S. Pat. No. 5,334,804. In those embodiments where capacitor-resistor layers 542 have been formed on top of connector layer 50, those wire interconnect structures 545 and 550 which carry signals (rather than power or ground) extend through vias in the capacitor-resistor layers 542 and are electrically connected to the signal lines in film connector layer 50.

As shown in FIGS. 10A and 10B, the substrate 522 is now removed, by an appropriate process such as etching or machining, in the parts 551A, 551B, 551C, 552A, 552B, 554A, 554B, 556A and 556B of power plate portions 528A, 528B and 528C. The layer 50 is then cut away in the areas 558 of FIG. 10A.

The interposer structures 524 are now ready to be produced by folding the parts 546A–C and 548A–C underneath the central parts 544A–C respectively (FIGS. 11A and 11B). In that condition, the wire interconnects 545 at the top of the interposers 524 are electrically connected to the wire interconnects 550 at the bottom of the interposers 524 through the controlled-impedance lines 532.

The chips 514 can now be mounted on the interconnect structures 545 (FIGS. 12A and 12B). The chips 514 are preferably flip-chip mounted to the interposers 524. Each chip is placed upside down on a corresponding interposer structure 524, and its circuitry is directly connected to the interconnect structures 545. As is shown in FIG. 13, the completed power plate assembly is placed on the signal module 512, and the wire interconnects 550 are connected in a conventional manner to the signal lines in module 512.

The power plate construction of this invention lends itself favorably to the production of three-dimensional multichip assemblies. As best illustrated by FIG. 14, the folding of the power plate parts 546A–C and 548A–C leaves openings 560 in the power plate 510. Separately fabricated Z-axis connectors constructed of interposer structures 562 similar to those described in connection with FIGS. 1–4 may be inserted through the openings 560 and may be used both to space and to interconnect successive pairs 564, 566 of power plates 510 and signal modules 512.

Although the power plate invention has been described herein in terms of portions of the power plate being folded under from both sides of a central part, it will be understood that the folding may be done (with an appropriate positioning of the power and ground vias) from one side only.

Figure 15:
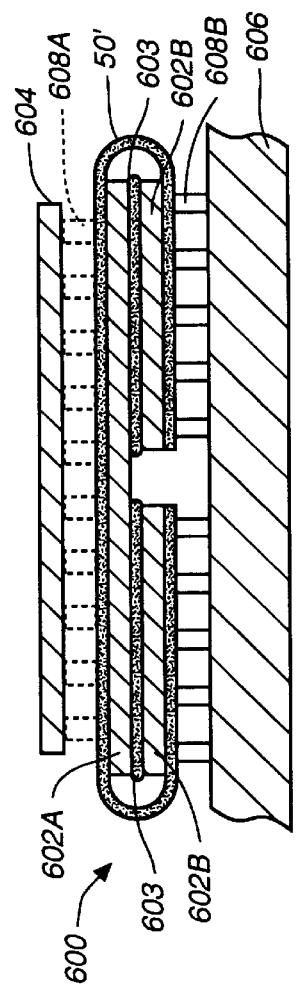

A cross-sectional view of a second interposer substrate according to the present invention is shown at 600 in FIG. 15, and a bottom plan view thereof is shown in FIG. 18A. Interposer 600 comprises a square-shaped primary substrate 602A, and four triangular-shaped secondary substrates 602B, each of which has its bottom surface positioned against the bottom surface of primary substrate 602A (only two of the four secondary substrates appear in the cross-section of FIG. 15). As an option, each of the secondary substrates 602B may be attached to primary substrate 602A by an adhesive material 603, or equivalent attachment means.

The exposed top surface of primary substrate 602A provides the top interconnect surface of interposer 600, and the exposed surfaces of secondary substrates 602B collectively provide the bottom interconnect surface of interposer 600. A thin film signal layer 50' is formed over the exposed surfaces of substrates 602A and 602B, which routes signals from the top surface of interposer 600 to the bottom surface thereof. Signal layer 50' comprises arrays of interconnectors 608A and 608B at the top and bottom interconnect surfaces, respectively. (Interconnectors 608A are shown in dashed lines in the cross-section of FIG. 15 because they are offset from the cross-section plane, which is defined in FIG. 18A). In preferred usage, an IC chip 614 is attached to interconnectors 608A on the interposer's top surface, and a signal module 606 (or the like) is attached to interconnectors 608B at the interposer's bottom surface. However, this arrangement may be reversed. Additionally, multiple chips may be attached to the top surface of interposer 600, if so desired.

As shown in FIGS. 16A and 16B, interposer 600 is produced by first forming a substrate 602 which is essentially square and larger than the interposer 600. For example, an interposer for a 16 mm square chip 604 may be formed from a single 29 mm square substrate. Portions of the single substrate 602 will be removed to define primary substrate 602A and the four secondary substrates 602B. The locations where substrates 602A and 602B will be defined are shown by dashed lines in FIG. 16A.

Signal line layer 50', which may have a structure like layer 50 of FIGS. 3 and 4, is formed on the surface of the substrate 602 and is substantially coextensive therewith. Layer 50' covers substantial portions of the locations where substrates 602A and 602B will be defined, and portions which bridge between these locations. Interconnect arrays 608A and 608B are then formed on top of layer 50' in those areas where substrates 602A and 602B will be formed. Any of the previously described interconnectors may be used. For the purposes of the present description, it will be assumed that wire interconnect technology (WIT) is chosen. Suitable electrical connections between layer 50' and interconnectors 608 are formed in a manner detailed above in connection with FIGS. 1–4. An exemplary signal routing pattern between one of the secondary substrates 602B and primary substrate 602A is shown at 605 in FIG. 16A. If signal layer 50' comprises strip lines to convey the signals, two ground planes are constructed within the signal layer, as described above with regard to the discussion of layer 50 shown in FIG. 4. In such a case, one or more of the secondary substrates 602B includes additional interconnectors configured to couple appropriate potentials to these ground planes. These interconnectors may be interspersed with those shown in FIG. 16A, or some of the existing interconnectors may be reconfigured to accept the ground plane potentials.

Referring to FIGS. 17A and 17B, portions of substrate 602 at the areas 610 and 612 are then removed to define primary substrate 602A and the four secondary substrates 602B. The secondary substrates 602B, which are at the corners of substrate 602, are then folded under the primary substrate 602A as shown in FIGS. 18A and 18B. The secondary substrates 602B may be attached to primary substrate 602A by any number of means, such as by an appropriate adhesive material or by solder bond connections. The type of attachment means is not essential to practicing the present invention in its broadest embodiments. The attachment means preferably enables each secondary substrate 602B to readily expand and contract under thermal cycling with little stress developing between the primary and secondary substrates. This can be readily achieved in a number of ways, such as by locating the attachment means at the center of the secondary substrate, or by using pliable adhesive material. Alternatively, the secondary substrates 602B may be left free so as to later be attached to the signal module 606. In those cases where attachment of the substrates is only needed for assembly purposes and is not needed for operation, a "breakable" adhesive, or tack adhesive, may be used (i.e., an adhesive that easily fractures under low stress).

Referring back to FIG. 15, a chip 604 can then be mounted on the array of wire interconnectors 608A, and the array of wire interconnectors 608B can be attached to a printed circuit board 606, or other suitable signal module. Secondary substrates 602B may be spaced apart from one another by a substantial amount (e.g., 1 mm or more) to form a cross-shaped ('X') gap area 614, which may be useful for subsequent alignment and assembly purposes. Additionally, a gap of as little as 25 μm within area 614 enables the secondary substrates 602B to expand and contract under thermal cycling without physically contacting one another, particularly when the secondary substrates are not rigidly attached to primary substrate 602A, or are attached to the primary substrate by a pliable attachment means. The division of the bottom surface of interposer 600 into four sections dramatically reduces the stress on the interconnectors at the bottom surface, and thereby dramatically increases the number of the thermal cycles that the bottom interconnectors can withstand before failing. For example, with ball-grid array (BGA) ball interconnectors, the number of thermal cycles before failure is increased by more than 16 times. This is a dramatic improvement in reliability over the standard BGA connection packages that exist today.

A third interposer embodiment according to the present invention is shown at 620 in FIGS. 19–21. Interposer 620 is suitable for lower-frequency, lowercost chip interposers for chips which have a low number of interconnect pads disposed around their peripheries. Referring to FIGS. 19 and 21, interposer 620 comprises substantially the same general construction as interposer 600 except that its secondary substrates 622B are rectangular in shape (rather than triangular) and cover less area, and that the interconnectors 608B on each secondary substrate 622B are arranged in one or more parallel rows (two rows are shown in FIG. 19). In preferred usage, the chip is attached to the secondary substrates 622B and the primary substrate 602A is coupled the signal module. The signal layer 50' may comprise controlled impedance lines, or simple traces. Exemplary signal routing patterns between each of the secondary substrates 622B and a corresponding edge of primary substrate 602A are shown in FIGS. 19 and 22. For an exemplary signal routing pattern within the area of primary substrate 602A, the exemplary pattern shown in FIG. 16A may be used.

An alignment frame 624, shown in plan view in FIG. 20 and in cross section in FIG. 21, may be interposed between the primary substrate 602A and the secondary substrates 622B. Alignment frame 624 comprises a plurality of shoulders 626, as shown in FIG. 20. Frame 624 is placed over the bottom surface of primary substrate 602A, and the secondary substrates 622B are folded around frame 624 until their edges abut against the shoulders 626 of frame 624. The interconnectors 608B disposed on the secondary substrates 622B are now in position to be precisely mated with the peripheral leads of the chip 616. In place of alignment shoulders 626, alignment lines or marks may be used on frame 624. Additionally, frame 624 may be formed integrally with primary substrate 602A with additional backside processing steps. For example, alignment shoulders 626 (or marks) may be formed on the bottom surface of primary substrate 602A, such as by depositing one or more patterned material layers on the bottom surface, or by pattern etching the bottom surface.

A fourth interposer embodiment according to the present invention suitable for wirebond connection of the IC chip is shown at 640 in FIGS. 22–24. In contrast to the preferred use of previously-described interposers, the top surface of interposer 640 is preferably coupled to a signal module rather than an IC chip, and the bottom surface thereof is coupled to an IC chip by wire bond connections (or equivalents thereof). The construction of interposer 640 is substantially similar to that of interposer 620 except that a different alignment frame 633 is used, and the interconnectors 608B on the secondary substrates 622B are limited to those types which can be used with wire bonding (e.g., pads). A top plan view of frame 633 is shown in FIG. 23. The top surface of frame 633 comprises a recessed portion 634 sized to accept primary substrate 602A, and a planar bottom surface, which may optionally include alignment marks or shoulders for secondary substrates 622B, as described above.

Referring to FIG. 24, the top surface of frame 633 is placed against the bottom surface of primary substrate 602A, with substrate 602A fitting into recess 634 of the frame. Secondary substrates 622B are then folded over, with their bottom surfaces against the bottom surface of frame 633. Secondary substrates 622B may be attached to frame 633 with adhesive material. One or more IC chips 616 may be attached to the bottom surface of frame 633 in the area bounded by the secondary substrates 622B. Wire bond connections 630 are then formed between the secondary substrates 622B and IC chip(s) 616.

Interposer 640 has a lower profile than interposer 620 since the IC chip is positioned at the same level as secondary substrates 622B, rather than being attached on top of substrates 622B. Although the wire bond connections generally have worse speed-transmission characteristics than controlled impedance signal lines formed in signal layers 50 and 50', the positioning of secondary substrates 622b next to the peripheral edge of the IC chip enables the wire bonds 630 to be very short, which reduces their detrimental effects on the overall transmission characteristics of interposer 640.

As mentioned above, a variety of techniques can be used to interconnect the interposers according to the present invention with the chips 604 or 616 and with the printed circuit board 606. The thin film interconnect layer 50 and 50' allows the use of several types of interconnect technologies to attach the IC to the chip interposer, such as solder bumps, barechip mounting technology (BMT), and the wire interconnect technology (WIT) disclosed in U.S. Pat. No. 5,334,804. On the opposite side from the IC chip, ball grid array (BGA) may also be used to solder the interposer to the next level of interconnect.

Typical interposers according to the present invention can support at least 900 connections between chip and substrate and substrate and next level of interconnect. This number of connections is significantly higher than that currently achieved by standard ceramic interposers and conventional signal-chip packages, whose low pin counts have been a major drawback of using interposers with ULSI chips. Signal layers 50 and 50' can be made of three to four metals depending on the transmission line construction. The metal layers carry attach pads, signals, power, and ground.

Other major drawbacks of existing interposers and single chip packages are addressed by the interposer substrate embodiments shown in FIGS. 15–24. For example, a conventional pin grid array (PGA) package having 250 pins is expensive and has severe electrical parasitics in the path from the PGA pins to the bond pads for the integrated circuit. These parasitics create impedance mismatches along the signal path, which in turn generate signal reflections and other electrical disturbances which hinder high-speed signal transmission. This new invention allows one to bond a thin film controlled impedance interconnect directly to the integrated circuit face in an area array pattern, and then bond this same thin film interconnect directly to the printed wiring board interconnect with significantly fewer impedance mismatches and electrical disturbances. This allows a high density area connection from chip to substrate, high-speed transmission of signals between the chip and the printed wiring board (PWB), and area array connection to the PWB surface in a ball grid array pattern.

Moreover, the interposers according to the present invention may be manufactured at low cost, are compatible with both standard and next-generation chip attachment methods (versatile for existing and new chips), are well suited to high volume manufacturing processes, and conform to existing assembly technology test and assembly processes.

While the present invention has been particularly described with respect to the illustrated embodiment, it will be appreciated that various alterations, modifications and adaptations may be made based on the present disclosure, and are intended to be within the scope of the present invention. For example, the invention may be practiced with various numbers of interconnecting signal lines as needed by the specific applications. Additionally, the location of the components may be rearranged for particular applications. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims. It will be apparent to those skilled in the art that there are many equivalents and alternatives to the precise structures described herein. Accordingly, it is intended that the above specification not be limiting and that the invention be understood solely in reference to the following claims.

What is claimed is:

1. An interposer substrate for coupling an integrated circuit chip to a multichip module substrate, comprising:

a rigid member having a first surface for mounting to said multichip module substrate and a second surface for receiving said integrated circuit chip, power distribution means for coupling power from said multichip module substrate to said integrated circuit chip, said power distribution means having a plurality of vias formed through said rigid member from said first surface to said second surface and wherein power is routed through said rigid member from said first surface to said second surface; and, controlled impedance signal path means for coupling signals from said multichip module substrate to said integrated circuit chip;

wherein said power distribution means and said controlled impedance signal path means are substantially isolated from each other.

2. The interposer of claim 1 further comprising:

a flexible, controlled impedance thin film connector, said thin film connector being mounted at one end thereof on said first surface and at a second end thereof on said second surface, wherein said signals are routed through said flexible, controlled impedance connector without passing through the body of said rigid member.

3. The interposer of claim 1 comprising an integral bypass capacitor coupled to said power distribution means.

4. The interposer of claim 1 comprising an integral terminal resistor coupled to said signal path means.

5. The interposer of claim 1 wherein said controlled impedance signal path means comprises a strip line.

6. The interposer of claim 2 wherein said rigid member comprises first and second segments, wherein said power distribution means comprises a plurality of vias formed through said first and second segments, and wherein said first and second segments are joined together by interconnecting ends of the vias formed in said first segment with ends of the vias formed in said second segment.

7. The interposer of claim 6 wherein said flexible connector comprises a first conductive layer, a first dielectric layer formed on said first conductive layer, a second conductive layer comprising a plurality of evenly spaced apart, substantially parallel signal lines formed on said first dielectric layer, a second dielectric layer formed on said second conductive layer, and a third conductive layer formed on said second dielectric layer.

8. The interposer of claim 6 wherein said vias are joined by solder bumps.

9. The interposer of claim 6 wherein said vias are joined by wire interconnects.

10. An interposer substrate for coupling an integrated circuit chip to a multichip module substrate, comprising:
   a first rigid member having coplanar first and second faces, said first rigid member having a plurality of vias formed therein, said vias providing electrical connection between said first and second faces;
   a second rigid member having coplanar first and second faces, said second rigid member having a plurality of vias formed therein, said vias providing electrical connection between said first and second faces;
   wherein the first face of said second rigid member is mounted on the first face of said first rigid member, and wherein electrical connection is made between vias in each of said rigid member such that the second face of said first rigid member is electrically coupled to the second face of said second rigid member;
   a bypass capacitor formed on the second face of said first rigid member, the plates of said capacitor being electrically connected to at least some of said vias; and,
   a controlled impedance flexible connector containing a plurality of signal paths linking opposite ends thereof, the first end of said flexible connector being attached to said second surface of said first rigid member and the second end of said flexible connector being attached to said second surface of said second rigid member.

11. The interposer of claim 10 further comprising a terminal resistor formed on a face of one of said rigid members and electrically coupled to one of said signal paths.

12. The interposer of claim 10 wherein said flexible connector comprises a thin film multilayered structure comprising plurality of polyimide and metal layers.

13. The interposer of claim 10 wherein said comprises a thin film multilayered structure comprising plurality of benzocyclobutene and metal layers.

14. The interposer of claim 10 wherein said rigid members comprise silicon or ceramic.

15. A power plate for carrying a plurality of IC chips and for coupling signals from the chips to a signal module substrate, the signal module substrate having a plurality of signal lines formed thereon, said power plate comprising:
   a substrate having a plurality of first substrate parts at which IC chips may be mounted, a plurality of power lines which route power to said first parts, and a plurality of second substrate parts underlying said first substrate parts, said first parts comprising a plurality of first interconnectors for coupling to integrated circuit chips, second parts having a plurality of second interconnectors for coupled to the signal lines of a signal module; and
   a plurality of flexible thin film connectors interconnecting said first and second interconnectors of said first and second substrate parts, respectively.

16. The power plate of claim 15 wherein said substrate comprises a plurality of openings, each opening being adjacent to a first substrate part; and wherein at least one opening has a thin film connector passes through it.

17. The power plate of claim 15, in which said thin film connectors are integrally formed with said first and second interconnectors.

18. The module of claim 15, in which said power lines are coupled to said chips by vias extending through said first substrate parts.

19. The power plate of claim 15, in which said second substrate parts are formed by cutting said second substrate parts out of said power plate and folding them under said first parts, thereby forming openings in said power plate.

20. The module of claim 15, in which a capacitive layer providing bypass capacitance for said power lines is formed on said substrate between said first interconnectors on said first substrate parts and said chips.

21. A multichip module for integrated circuit chips, comprising:
   a) a signal module having a first plurality of signal lines formed thereon for interconnecting said integrated circuit chips;
   b) a power plate having a substrate, said substrate having a plurality of power lines for powering said integrated circuit chips; and
   c) means for connecting said first signal lines of said signal module to said integrated circuit chips, said connecting means including:
      first parts of said substrate having formed thereon a plurality of second signal lines adapted to be connected to integrated circuit chips affixed to said parts;
      second substrate parts underlying first parts and having formed thereon a plurality of third signal lines adapted to be connected to said first signal lines formed on said signal module; and
      a plurality of flexible, controlled impedance thin film connectors interconnecting said second and third signal lines of said first and second substrate parts, respectively, and
   d) wherein said power plate and said signal module are spaced from one another by said second substrate parts.

22. The multichip module of claim 21 wherein said substrate of said power plate comprises a plurality of openings, each opening being adjacent to a first substrate part of said power plate,
   wherein at least one said opening has a thin film connector passing through it, and
   wherein said multichip module is multilayered by stacking sets of said signal modules and power plates over each other, and spacing said signal modules from one another by substantially interposers extending through said openings in said power plates.

23. The module of claim 22, in which said second substrate parts are formed by cutting said second substrate parts out of said power plate and folding them under said first parts, thereby forming said openings in said power plate.

* * * * *